United States Patent
Mun et al.

(10) Patent No.: US 11,877,437 B2
(45) Date of Patent: Jan. 16, 2024

(54) SEMICONDUCTOR DEVICE WITH LOW-K SPACER

(71) Applicant: SK hynix Inc., Gyeonggi-do (KR)

(72) Inventors: Beom Ho Mun, Gyeonggi-do (KR); Eun Jeong Kim, Gyeonggi-do (KR); Jong Kook Park, Gyeonggi-do (KR); Seung Mi Lee, Gyeonggi-do (KR); Ji Won Choi, Gyeonggi-do (KR); Kyoung Tak Kim, Gyeonggi-do (KR); Yun Hyuck Ji, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 288 days.

(21) Appl. No.: 17/374,578

(22) Filed: Jul. 13, 2021

(65) Prior Publication Data

US 2022/0059543 A1      Feb. 24, 2022

(30) Foreign Application Priority Data

Aug. 21, 2020   (KR) .......................... 10-2020-0105302
Jan. 29, 2021   (KR) .......................... 10-2021-0013422

(51) Int. Cl.
*H10B 12/00* (2023.01)

(52) U.S. Cl.
CPC ....... *H10B 12/315* (2023.02); *H10B 12/0335* (2023.02); *H10B 12/34* (2023.02); *H10B 12/482* (2023.02)

(58) Field of Classification Search
None
See application file for complete search history.

(56) References Cited

U.S. PATENT DOCUMENTS

| | | | |
|---|---|---|---|
| 10,347,643 B1 | 7/2019 | Yang et al. | |
| 10,546,810 B2 | 1/2020 | Park | |
| 2018/0040560 A1* | 2/2018 | Kim | .................... H01L 23/5283 |
| 2018/0347035 A1 | 12/2018 | Weimer et al. | |
| 2019/0088739 A1 | 3/2019 | Lee et al. | |
| 2020/0020697 A1* | 1/2020 | Kim | .................... H10B 12/482 |

* cited by examiner

*Primary Examiner* — Steven M Christopher
(74) *Attorney, Agent, or Firm* — IP & T GROUP LLP

(57) ABSTRACT

A semiconductor device includes: a semiconductor device, comprising: a bit line structure including a bit line contact plug, a bit line, and a bit line hard mask that are sequentially stacked over a substrate; a storage node contact plug that is spaced apart from the bit line structure; a conformal spacer that is positioned between the bit line and the storage node contact plug and includes a low-k material; and a seed liner that is positioned between the conformal spacer and the bit line and thinner than the conformal spacer.

28 Claims, 36 Drawing Sheets

SEMICONDUCTOR DEVICE WITH LOW-K SPACER

CROSS-REFERENCE TO RELATED APPLICATIONS

The present application claims priority of Korean Patent Application Nos. 10-2020-0105302 and 10-2021-0013422, filed on Aug. 21, 2020, and Jan. 29, 2021, respectively, which are incorporated herein by reference in their entireties.

BACKGROUND

1. Field

Various embodiments of the present invention relate generally to a semiconductor device and, more particularly, to a semiconductor device having a low-k spacer.

2. Description of the Related Art

In a semiconductor device, a dielectric material may be formed between neighboring pattern structures. As semiconductor devices become more highly integrated, the distance between pattern structures is getting increasingly smaller which in turn may raise the occurrence of significant parasitic capacitance issues. This is because an increase in the parasitic capacitance may deteriorate the performance of a semiconductor device. Thus, addressing the parasitic capacitance issues has become a limiting factor that needs to be addressed in order to obtain further enhancements in semiconductor device integration.

SUMMARY

Embodiments of the present invention are directed to a semiconductor device capable of reducing parasitic capacitance between neighboring pattern structures.

In accordance with an embodiment of the present invention, a semiconductor device includes: a bit line structure including a bit line contact plug, a bit line, and a bit line hard mask that are sequentially stacked over a substrate; a storage node contact plug that is spaced apart from the bit line structure; a conformal spacer that is positioned between the bit line and the storage node contact plug and includes a low-k material; and a seed liner that is positioned between the conformal spacer and the bit line, wherein the seed liner is thinner than the conformal spacer.

In accordance with another embodiment of the present invention, a semiconductor device includes: bit lines that are spaced apart from each other by a line-shaped opening over a substrate; bit line contact plugs that are positioned below the bit lines, respectively; a plurality of plug isolation layers that divide the line-shaped opening into a plurality of contact openings; storage node contact plugs that respectively fill the contact openings; a first spacer structure that is disposed between the storage node contact plugs and the bit lines, and includes a stack of a first silicon nitride, a first low-k material, silicon oxide, and a second low-k material; and a second spacer structure that is disposed between the bit line contact plugs and the storage node contact plugs, and includes a stack of a second silicon nitride, a third low-k material, and a third silicon nitride, wherein the second silicon nitride extends from the first silicon nitride, and the third low-k material extends from the first low-k material.

In accordance with yet another embodiment of the present invention, a method for fabricating a semiconductor device includes: forming a plurality of bit line structures including a bit line contact plug and a bit line over the bit line contact plug over a substrate; forming spacer structures on sidewalls of the bit line structures; and forming a storage node contact plug contacting the spacer structure between the bit line structures, wherein the forming of the spacer structures includes: forming a nitrogen-containing seed liner on the sidewalls of the bit line structures; and conformally forming a first low-k spacer having a lower dielectric constant than the nitrogen-containing seed liner over the nitrogen-containing seed liner.

These and other advantages and features of the present invention will become better understood from the following detailed description in view of the accompanying figures.

DETAILED DESCRIPTION

Figure 1:
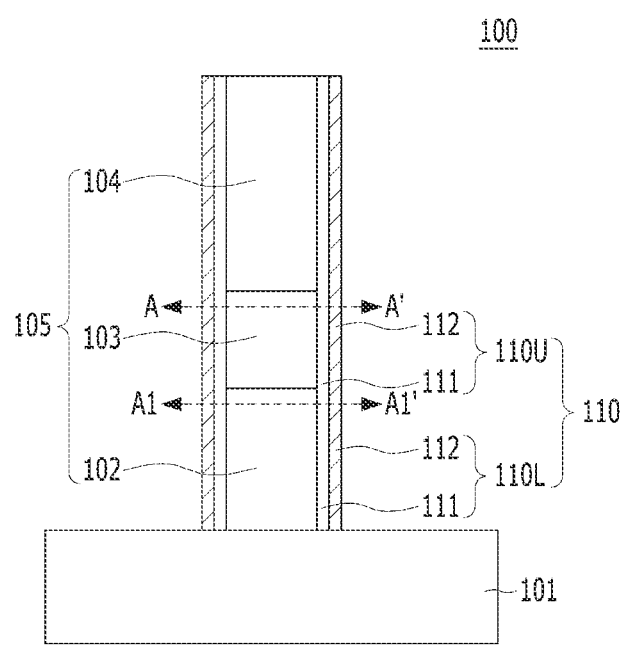
FIG. 1 is a cross-sectional view illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and ti will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
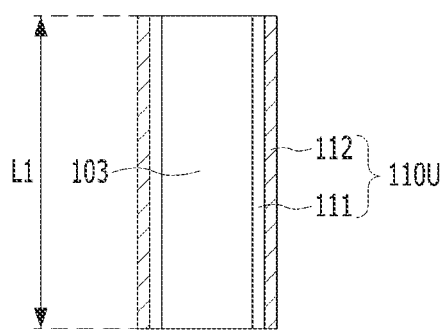
FIG. 2A is a cross-sectional view taken along a line A-A' of FIG. 1.
Figure 2B:
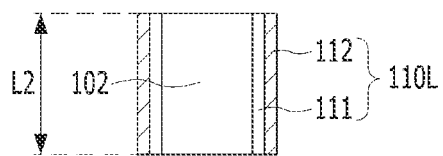
FIG. 2B is a cross-sectional view taken along a line A1-A1' of FIG. 1.

FIG. 1 is a cross-sectional view illustrating a semiconductor device in accordance with an embodiment of the present invention, FIG. 2A is a cross-sectional view taken along a line A-A' of FIG. 1. FIG. 2B is a cross-sectional view taken along a line A1-A1' of FIG. 1.

Referring to FIGS. 1, 2A, and 2B, the semiconductor device 100 may include a substrate 101, a pattern structure 105, and a dielectric structure 110 formed on both sidewalls of the pattern structure 105. The both sidewalls may be opposite sidewalk.

The pattern structure 105 may be formed over the substrate 101. The pattern structure 105 may include a first conductive pattern 102 which is formed over the substrate 101. The pattern structure 105 may further include a second conductive pattern 103 over the first conductive pattern 102 and a hard mask pattern 104 over the second conductive pattern 103. The first conductive pattern 102 may directly contact the substrate 101. Although not illustrated, the first conductive pattern 102 and the substrate 101 may be electrically disconnected by an isolating material or a dielectric material layer. The first conductive pattern 102 and the second conductive pattern 103 may be in direct contact and may include polysilicon, a metal, a metal nitride, a metal silicide, or a combination thereof. The hard mask pattern 104 may be formed directly on the second conductive pattern 103 and may include a dielectric material.

Referring to FIG. 1, a length L1 of the second conductive pattern 103 may be shorter than a length L2 of the first conductive pattern 102. Referring to FIGS. 2A and 2B, the pattern structure 105 may extend in one direction. In an embodiment, the length L1 of the second conductive pattern 103 may be longer than the length L2 of is the first conductive pattern 102. The second conductive pattern 103 may extend while overlapping with the first conductive pattern 102.

The dielectric structure 110 may include a lower-level dielectric structure 110L and an upper-level dielectric structure 110U. The upper-level dielectric structure 110U may be positioned on both sidewalls of the second conductive pattern 103 and the hard mask pattern 104 of the pattern structure 105, but may extend longer in one direction which will be referred to as the length direction of the upper-level dielectric structure 110U and of the pattern structure 105 more generally. Along the length direction of the pattern structure 105, the lower-level dielectric structure 110L may be positioned on both sidewalls of the first conductive pattern 102 of the pattern structure 105. The length L2 of the lower-level dielectric structure 110L may be shorter than the length L1 of the upper-level dielectric structure 110U. The upper-level dielectric structure 110U may be positioned at a higher level than the lower-level dielectric structure 110L. The lower-level dielectric structure 110L and the upper-level dielectric structure 110U may be integrated, meaning that they are formed as a single continuous structure without a break. The lower-level dielectric structure 110L may continue vertically from the upper-level dielectric structure 110U. The lower-level dielectric structure 110L and the upper-level dielectric structure 110U may have the same structure. The lower-level dielectric structure 110L and the upper-level dielectric structure 110U may be made of the same material or materials. In an embodiment, the lower-level dielectric structure 110L and the upper-level dielectric structure 110U may have the same structure or the same material.

The dielectric structure 110 may include a multi-layer dielectric material. The dielectric structure 110 may include a seed liner 111 which is positioned on both sidewalk of the pattern structure 105. The dielectric structure 110 may further include a conformal layer 112 formed over the seed liner 111. A stack of the seed liner 111 and the conformal layer 112 may be positioned on both sidewalls of the first conductive pattern 102. A stack of the seed liner 111 and the conformal layer 112 may be positioned on both sidewalls of the second conductive pattern 103. The lower-level dielectric structure 110L and the upper-level dielectric structure 110U may each include a stack of the seed liner 111 and the conformal layer 112.

The seed liner 111 may serve as a seed for depositing the conformal layer 112. The seed liner 111 may improve the step coverage of the conformal layer 112. The seed liner 111 may have a thickness of approximately 20 Å or less. The seed liner 111 may have a thickness of from approximately 1 Å to approximately 20 Å.

The conformal layer 112 may have a first dielectric constant, and the seed liner 111 may have a second dielectric constant. The first dielectric constant may have a value which is lower than that of the second dielectric constant. The conformal layer 112 may have a lower dielectric constant than the seed liner 111. For example, the second dielectric constant may be approximately 7.5, and the first dielectric constant may be less than approximately 7. For example, the first dielectric constant may be approximately 4.4 or less. In an embodiment, the conformal layer 112 may include a low-k material and the seed liner 111 may have a greater dielectric constant than a low-k material. The conformal layer 112 may have a dielectric constant which is lower than that of silicon oxide. For example, in an embodiment, the seed liner 111 may include silicon nitride and the conformal layer 112 may have a lower dielectric constant than silicon oxide. The seed liner 111 may be thinner than the conformal layer 112. Accordingly, the thickness of the conformal layer 112 occupying in the dielectric structure 110 may be relatively large compared to the thickness of the seed liner 111 and since the seed liner 111 is thin, the total dielectric constant of the dielectric structure 110 may be lowered.

The seed liner 111 and the conformal layer 112 may include a silicon-based material. The seed liner 111 and the conformal layer 112 may include a silicon-based dielectric material. The seed liner 111 may not contain an impurity, and the conformal layer 112 may contain an impurity. As the conformal layer 112 contains an impurity, the dielectric constant of the conformal layer 112 may be lower than that of the seed liner 111. The seed liner 111 may contain an impurity-free silicon-based material, and the conformal layer 112 may contain an impurity-containing silicon-based material. The conformal layer 112 may contain carbon, boron, or a combination thereof as an impurity. The impurity-containing silicon base material may include a carbon-containing material, a boron-containing material, or a carbon and boron-containing material. For example, the impurity-containing silicon-based material may include SiC (silicon carbide), SiCO (silicon oxycarbide), SiCN (silicon carbon nitride), SiOCN (silicon oxycarbonitride), SiBN (silicon boron nitride) or SiBCN (silicoboron carbonitride). The seed layer 110 may include silicon nitride, and the conformal layer 112 may include SiC, SiCO, SiCN, SiOCN, SiBN, or SiBCN. The seed liner 111 may block diffusion of impurities from the conformal layer 112.

The dielectric structure 110 may include an NK (Nitride-Low k) is structure. In the NK structure, N may correspond to the seed liner 111, and K may correspond to the conformal layer 112. The NK structure may be formed of a stack of the seed liner 111 and the conformal layer 112. An example of the NK structure may include a stack of silicon nitride and a low-k material. Another example of the NK structure may include a stack of silicon nitride and an impurity-containing silicon-based material. An example of the NK structure may include a stack of $Si_3N_4$/SiCO.

Figure 3A:
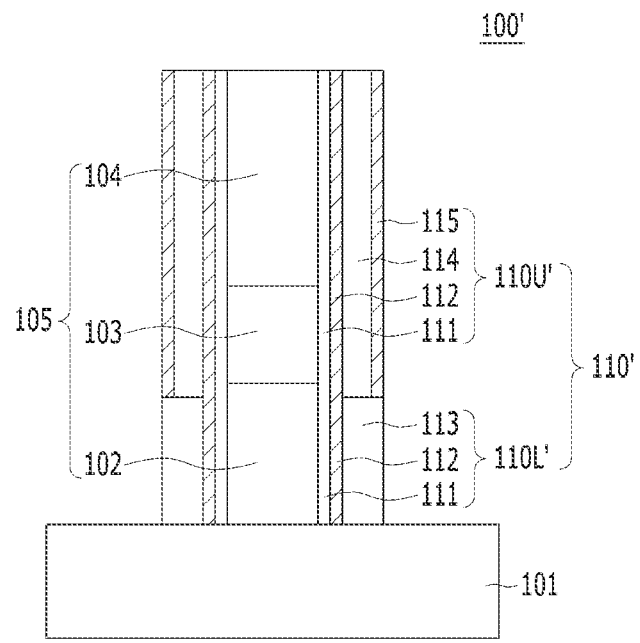
FIGS. 3A and 3B are cross-sectional views illustrating semiconductor devices in accordance with other embodiments of the present invention.
Figure 3B:
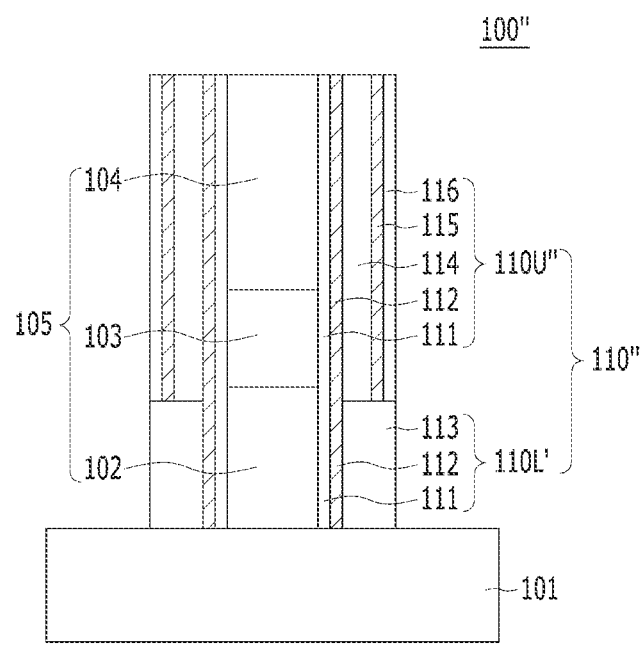

FIGS. 3A and 3B are cross-sectional views illustrating semiconductor devices in accordance with other embodiments of the present invention.

Figure 33:
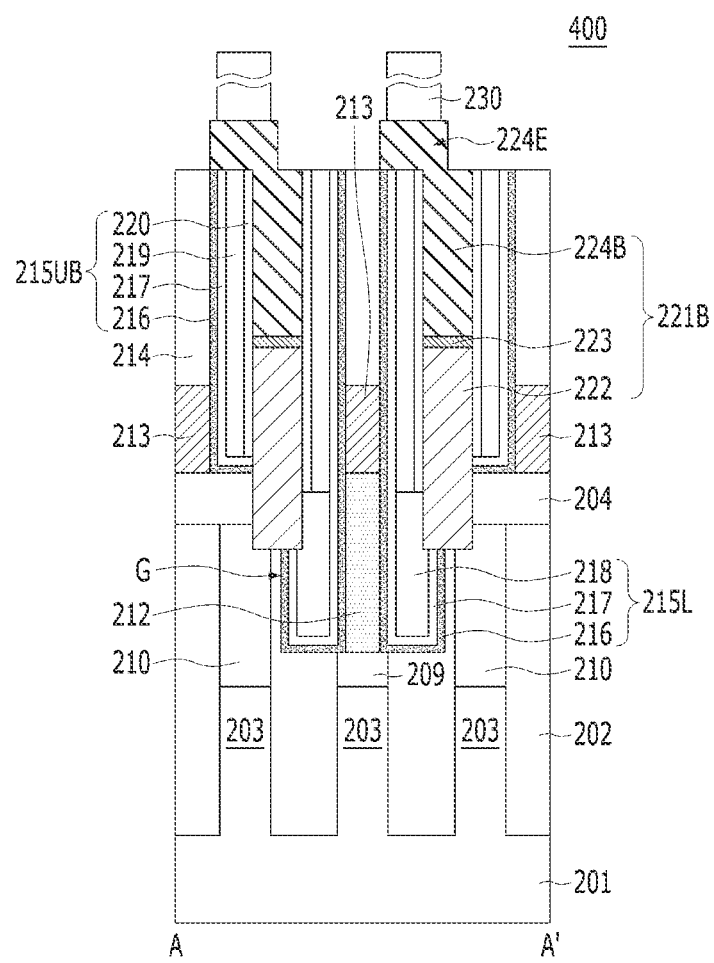
FIGS. 33 and 34 are cross-sectional views illustrating a method of fabricating a semiconductor device in accordance with other embodiments of the present invention.

The semiconductor devices 100' and 100" of FIGS. 3A and 33, respectively, may be similar to the semiconductor device 100 of FIG. 1.

The semiconductor device 100' of FIG. 3A may include a substrate 101, a pattern structure 105 over the substrate 101, and a dielectric structure 110' on both sides of the pattern structure 105.

The pattern structure 105 may include a first conductive pattern 102 formed over the substrate 101. The pattern structure 105 may further include a second conductive pattern 103 over the first conductive pattern 102 and a hard mask pattern 104 over the second conductive pattern 103. The first conductive pattern 102 may be in direct contact with the substrate 101. The first conductive pattern 102 and the substrate 101 may be electrically disconnected by an isolating material or a dielectric material layer. The first conductive pattern 102 and the second conductive pattern 103 may be in direct contact and may include polysilicon, a metal, a metal nitride, a metal silicide, or a combination thereof. The hard mask pattern 104 may be formed directly on the second conductive pattern 103 and may include a dielectric material. A pattern structure 105 may extend longer in one direction, which will be referred to as the length direction. As shown in FIG. 3A, the length L1 of the second conductive pattern 103 may be shorter than the length L2 of the first conductive pattern 102. The second conductive pattern 103 may extend while overlapping with the first conductive pattern 102. In an embodiment, the length L1 of the second conductive pattern 103 may be longer than the length L2 of the first conductive pattern 102 as shown in FIGS. 2A and 2B.

The dielectric structure 110' may include a lower-level dielectric structure 110L' and an upper-level dielectric structure 110U'. The upper-level dielectric structure 110U' may be positioned on both sidewalls of the second conductive pattern 103 and the hard mask pattern 104 of the pattern structure 105, but may extend longer in its length direction. The lower-level dielectric structure 110L' may be positioned on both sidewalls of the first conductive pattern 102 of the pattern structure 105. The lower-level dielectric structure 110L' along the length direction of the pattern structure 105 may be shorter than the upper-level dielectric structure 110U'. The upper-level dielectric structure 110U' may be positioned at a higher level than the lower-level dielectric structure 110L. The lower-level (dielectric structure 110L' and the upper-level dielectric structure 110U' may include a common portion of an integrated type. The integrated-type common portion may vertically continue from the lower-level dielectric structure 110L' to the upper-level dielectric structure 110U'. The lower-level dielectric structure 110L' and the upper-level dielectric structure 110U' may have different structures or different materials.

The dielectric structure 110' may include a mufti-layer dielectric material. The dielectric structure 110' may include a seed liner 111 positioned on both sidewalls of the pattern structure 105, The dielectric structure 110' may further include a conformal layer 112 formed over the seed liner 111. A stack of the seed liner 111 and the conformal layer 112 may be positioned on both sidewalls of the first conductive pattern 102. A stack of the seed liner 111 and the conformal layer 112 may be positioned on both sidewalls of the second conductive pattern 103. The lower-level dielectric structure 110L' and the upper-level dielectric structure 110U' may include a stack of the seed liner 111 and the conformal layer 112 in common.

The seed liner 111 may serve as a seed for depositing the conformal layer 112. The step coverage of the conformal layer 112 may be improved by the seed liner 111. The seed liner 111 may have a thickness of approximately 20 Å or less. In an embodiment, the seed liner 111 may have a thickness of approximately 1 to approximately 20 Å. The seed liner 111 may be thinner than the conformal layer 112.

The conformal layer 112 may have a first dielectric constant, and the seed liner 111 may have a second dielectric constant. The first dielectric constant may have a lower value than the second dielectric constant. The conformal layer 112 may have a lower dielectric constant than the seed liner 111. The first dielectric constant may be approximately 4.4 or less, and the second dielectric constant may be approximately 7.5. The conformal layer 112 may include a low-k material. The seed liner 111 may have a greater dielectric constant than a low-k material. The seed liner 111 may include silicon nitride, and the conformal layer 112 may have a lower dielectric constant than that of silicon nitride. The conformal layer 112 may have a lower dielectric constant than that of silicon oxide.

The seed liner 111 and the conformal layer 112 may include a silicon-based material. The seed liner 111 may not contain an impurity, and the conformal layer 112 may contain an impurity. As the conformal layer 112 contains an impurity, the dielectric constant of the conformal layer 112 may be lower than that of the seed liner 111. The seed liner 111 may contain an impurity-free silicon-based material, and the conformal layer 112 may contain an impurity-containing silicon-based material. The conformal layer 112 may include a carbon-containing material, a boron-containing material, or a carbon and boron-containing material. For example, the conformal layer 112 may include carbon, boron, or a combination thereof as an impurity. The impurity-containing silicon-based material may include SiCO, SiCN, SiOCN, SiBN, or SiBCN. The seed liner 111 may include silicon nitride, and the conformal layer 112 may include SiC, SiCO, SiCN, SiOCN, SiBN, or SiBCN.

The dielectric structure 110' may further include a first spacer 113, a second spacer 114, and a third spacer 115. The first spacer 113 may be formed over the conformal layer 112. The seed liner 111 and the conformal layer 112 may be positioned between the first spacer 113 and the first conductive pattern 102. The second spacer 114 may be formed over the conformal layer 112, and the third spacer 115 may be formed over the second spacer 114. The seed liner 111 and the conformal layer 112 may be positioned between the second conductive pattern 103 and the second spacer 114, and the second spacer 114 may be positioned between the conformal layer 112 and the third spacer 115.

The lower-level dielectric structure 110L' may include a stack of the seed liner 111, the conformal layer 112, and the first spacer 113. The upper-level dielectric structure 110U' may include a stack of the seed liner 111, the conformal layer 112, the second spacer 114, and the third spacer 115. The third spacer 115 may have a lower dielectric constant than the first and second spacers 113 and 114. According to another embodiment of the present invention, the third spacer 115 may have a higher dielectric constant than the second spacer 114. The conformal layer 112 and the third spacer 115 may have the same dielectric constant. According to another embodiment of the present invention, the third spacer 115 may have a higher dielectric constant than the conformal layer 112. The third spacer 115 having an excellent etching resistance. Accordingly, the third spacer 115 may prevent loss of the second spacer 114. The conformal layer 112 and the third spacer 115 may be formed of the same material. The first spacer 113 and the second spacer 114 may be formed of different materials. The first spacer 113 may include silicon nitride, and the second spacer 114 may include silicon oxide. The third ti spacer 115 may contain an impurity-containing silicon-based material. The third spacer 115 may contain a carbon-containing material, a boron-containing material, or a carbon and boron-containing material. For example, the third spacer 115 may contain carbon, boron, or a combination thereof as an impurity. The impurity-containing silicon-based material may include SiC, SiCO, SiCN, SiOCN, SiBN, or SiBCN.

The lower-level dielectric structure 110L' may include an NKN (Nitride-Low k-Nitride) structure. The NKN structure may be formed of a stack of the seed liner 111, the conformal layer 112, and the first spacer 113. An example of the NKN structure may include a stack of silicon nitride, a low-k material, and silicon nitride. Another example of the NKN structure may include a stack of silicon nitride, an impurity-containing silicon-based material, and silicon nitride. An example of the NKN structure may include a stack of $Si_3N_4/SiCO/Si_3N_4$.

The upper-level dielectric structure 110U' may include an NKOK (Nitride-Low k-Oxide-Low k) structure. The NKOK structure may be formed of a stack of the seed liner 111, the conformal layer 112, the second spacer 114, and the third spacer 115. An example of the NKOK structure may include a stack of silicon nitride, a low-k material, silicon oxide, and a low-k material. Another example of the NKOK structure may include a stack of silicon nitride, an impurity-containing silicon-based material, silicon oxide, an impurity-containing silicon-based material. An example of the NKOK structure may include a stack of $Si_3N_4/SiCO/SiO_2/SiCO$.

The semiconductor device 100" of FIG. 3B may include a substrate 101, a pattern structure 105 over the substrate 101, and a (dielectric structure 110" on both sides of the pattern structure 105.

The pattern structure 105 may include a first conductive pattern 102 formed over the substrate 101. The pattern structure 105 may further include a second conductive pattern 103 over the first conductive pattern 102 and a hard mask pattern 104 over the second conductive pattern 103. The first conductive pattern 102 may directly contact the substrate 101. The first conductive pattern 102 and the substrate 101 may be electrically disconnected by an isolating material or a dielectric material layer. The first conductive pattern 102 and the second conductive pattern 103 may be in direct contact and may include polysilicon, a metal, a metal nitride, a metal silicide, or a combination thereof. The hard mask pattern 104 may be formed directly on the second conductive pattern 103 and may include a dielectric material. The pattern structure 105 may extend in one direction. As illustrated in FIGS. 2A and 2B, the length L1 of the second conductive pattern 103 may be longer than the length L2 of the first conductive pattern 102. The second conductive pattern 103 may extend while overlapping with the first conductive pattern 102.

The dielectric structure 110" may include a lower-level dielectric structure 110L' and an upper-level dielectric structure 110U". The upper-level dielectric structure 110U" may be positioned on both sidewalls of the second conductive pattern 103 and the hard mask pattern 104 of the pattern structure 105, but may extend longer in the length direction of the pattern structure 105. The lower-level dielectric structure 110L' may be positioned on both sidewalls of the first conductive pattern 102 of the pattern structure 105. Along the length direction of the pattern structure 105, the lower-level dielectric structure 110lJ may be shorter than the upper-level dielectric structure 110U". The upper-level dielectric structure 110U" may be positioned at a higher level than the lower-level dielectric structure 110L'. The lower-level dielectric structure 110L' and the upper-level dielectric structure 110U" may have an integrated-type common portion. The integrated-type common portion may continue from the upper-level dielectric structure 110U" to the lower-level dielectric structure 110L'. The lower-level dielectric structure 110L' and the upper-level dielectric structure 110U" may have different structures or different materials.

The dielectric structure 110" may include a multi-layer dielectric material. The dielectric structure 110" may include a seed liner 111 which is positioned on both sidewalls of the pattern structure 105. The dielectric structure 110' may further include a conformal layer 112 formed over the seed liner 111. A stack of the seed liner 111 and the conformal layer 112 may be positioned on both sidewalls of the first conductive pattern 102. A stack of the seed liner 111 and the conformal layer 112 may be positioned on both sidewalls of the second conductive pattern 103. Each of the lower-level dielectric structure 110L' and the upper-level dielectric structure 110U" may include a stack of the seed liner 111 and the conformal layer 112.

The seed liner 111 may serve as a seed for depositing the conformal layer 112. The step coverage of the conformal layer 112 may be improved by the seed liner 111. The seed liner 111 may have a thickness of approximately 20 Å or less. In an embodiment, the seed liner 111 may have a thickness of approximately 1 to approximately 20 Å. The seed liner 111 may be thinner than the conformal layer 112.

The conformal layer 112 may have a first dielectric constant, and the seed liner 111 may have a second dielectric constant. The first dielectric constant may have a lower value than the second dielectric constant. The conformal layer 112 may have a lower dielectric constant than the seed liner 111. For example, the first dielectric constant may be approximately 3.9 or less, and the second dielectric constant may be approximately 7.5. The conformal layer 112 may include a low-k material. The seed liner 111 may have a higher dielectric constant than a low-k material. The conformal layer 112 may have a lower dielectric constant than silicon oxide. The seed liner 111 may include silicon nitride.

The seed liner 111 and the conformal layer 112 may include a silicon-based material. The seed liner 111 may not contain an impurity, and the conformal layer 112 may contain an impurity. As the conformal layer 112 contains an impurity, the dielectric constant of the conformal layer 112 may be lower than that of the seed liner 111. The seed liner 111 may include an impurity-free silicon-based material, and the conformal layer 112 may include an impurity-containing silicon-based material. The conformal layer 112 may include a carbon-containing material, a boron-containing material, or a carbon and boron-containing material. For example, the conformal layer 112 may include carbon, boron, or a combination thereof as an impurity. The impurity-containing silicon-based material may include SiCO, SiCN, SiOCN, SiBN, or SiBCN. The seed liner 111 may include silicon nitride, and the conformal layer 112 may include SiCO, SiCN, SiOCN, SiBN, or SiBCN.

The dielectric structure 110" may further include a first spacer 113, a second spacer 114, a third spacer 115, and a fourth spacer 116. The first spacer 113 may be conformally formed over the conformal layer 112. The seed liner 111 and the conformal layer 112 may be positioned between the first spacer 113 and the first conductive pattern 102. The second spacer 114 may be formed over the conformal layer 112, and the third spacer 115 may be formed over the second spacer 114. The fourth spacer 116 may be formed over the third spacer 115. The seed liner 111 and the conformal layer 112 may be positioned between the second conductive pattern 103 and the second spacer 114, and the second spacer 114 may be positioned between the conformal layer 112 and the third spacer 115. The third spacer 115 may be positioned between the second spacer 114 and the fourth spacer 116.

The lower-level dielectric structure 110L' may include a stack of the seed liner 111, the conformal layer 112, and the first spacer 113. The upper-level dielectric structure 110U''' may include a stack of the seed liner 111, the conformal layer 112, the second spacer 114, the third spacer 115, and the fourth spacer 116. The third spacer 115 may have a lower dielectric constant than the first spacer 113, the second spacer 114, and the fourth spacer 116. The conformal layer 112 and the third spacer 115 may have the same dielectric constant. The conformal layer 112 and the third spacer 115 may be formed of the same material, and the first spacer 113 and the second spacer 114 may be formed of different materials from the material of the conformal layer 112 and the third spacer 115. The seed liner 111, the first spacer 113, and the fourth spacer 116 may include silicon nitride, and the second spacer 114 may include silicon oxide. The third spacer 115 may include an impurity-containing silicon-based material. The third spacer 115 may include a carbon-containing material, a boron-containing material, or a carbon and boron-containing material. For example, the third spacer 115 may include carbon, boron, or a combination thereof as an impurity. The ti impurity-containing silicon-based material may include SiC, SiCO, SiCN, SiOCN, SiBN, or SiBCN.

The lower-level dielectric structure 110L' may include an NKN (Nitride-Low k-Nitride) structure. The NKN structure may be formed of a stack of the seed liner 111, the conformal layer 112, and the first spacer 113. An example of the NKN structure may include a stack of silicon nitride, a low-k material, and silicon nitride. Another example of the NKN structure may include a stack of silicon nitride, an impurity-containing silicon-based material, and silicon nitride. An example of the NKN structure may include a stack of $Si_3N_4/SiCO/Si_3N_4$.

The upper-level dielectric structure 110U''' may include an NKOKN (Nitride-Low k-Oxide-Low k-Nitride) structure. The NKOKN structure may include the seed liner 111, the conformal layer 112, the second spacer 114, the third spacer 115, and the fourth spacer 116. An example of the NKOKN structure may include a stack of silicon nitride, a low-k material, silicon oxide, a low-k material, and silicon nitride. Another example of the NKOKN structure may include a stack of silicon nitride, an impurity-containing silicon-based material, silicon oxide, an impurity-containing silicon-based material, and silicon nitride. An example of the NKOKN structure may include a stack of $Si_3N_4/SiCO/SiO_2/SiCO/Si_3N_4$.

Figure 4:
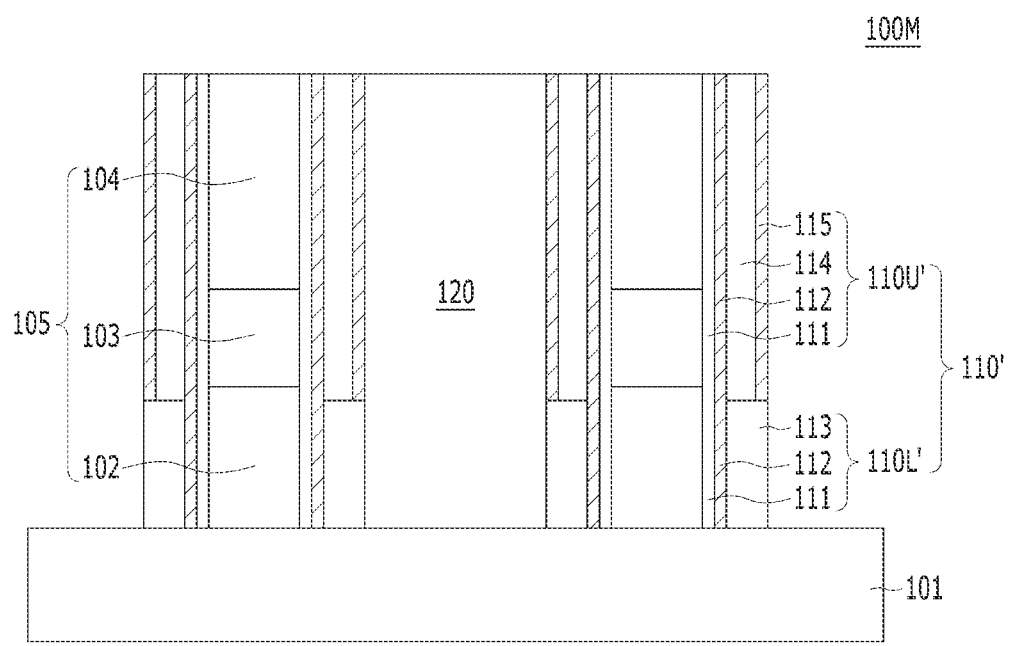
FIG. 4 is a cross-sectional view illustrating a semiconductor device in accordance with another embodiment of the present invention.

FIG. 4 is a cross-sectional view illustrating a semiconductor device 100M in accordance with another embodiment of the present invention. In FIG. 4, the same reference numerals appearing in FIGS. 1 to 3B may denote the same constituent elements.

The semiconductor device 100M shown in FIG. 4 may be similar to the above-described semiconductor devices 100, 100', and 100". The semiconductor device 100M may be similar to the semiconductor device 100' of FIG. 3A. Hereinafter, detailed description on the constituent elements of FIG. 4 also appearing in FIGS. 1 to 3B may be omitted.

Referring to FIG. 4, the semiconductor device 100M may include a substrate 101, pattern structures 105 over the substrate 101, a plug structure 120 between the pattern structures 105, and a dielectric structure 110' between the pattern structures 105 and the plug structure 120.

Each of the pattern structures 105 may include a first conductive pattern 102 formed over the substrate 101. The pattern structures 105 may further include a second conductive pattern 103 over the first conductive pattern 102 and a hard mask pattern 104 over the second conductive pattern 103. The first conductive pattern 102 may be in direct contact with the substrate 101. The first conductive pattern 102 and the substrate 101 may be electrically disconnected by an isolating material or a dielectric material layer. The first conductive pattern 102 and the second conductive pattern 103 may include polysilicon, a metal, a met& nitride, a metal silicide, or a combination thereof. The hard mask pattern 104 may be formed directly on the second conductive pattern 103 and may include a dielectric material. The pattern structures 105 may be for example stacked on the substrate 101 in a direction perpendicular to a top surface of the substrate 101 and extend in one direction.

The dielectric structure 110' may include a lower-level dielectric structure 110L' and an upper-level dielectric structure 110U'. The upper-level dielectric structure 110U' may be positioned on both sidewalls of the second conductive pattern 103 and the hard mask pattern 104 of the pattern structure 105. The upper-level dielectric structure 110U' may extend long in the length direction. The lower-level dielectric structure 110L' may be positioned on both sidewalls of the first conductive pattern 102 of the pattern structures 105. Along the length direction of the pattern structures 105, the lower-level dielectric structure 110L' may be shorter than the upper-level (dielectric structure 110U'. The upper-level dielectric structure 110U' may be positioned at a higher level than the lower-level dielectric structure 110L. The lower-level dielectric structure 110L' and the upper-level dielectric structure 110U' may include a common portion of an integrated type. The integrated-type common portion may include the seed liner 111 and the conformal layer 112 and may continue from the upper-level dielectric structure 110U' to the lower-level dielectric structure 110L. The lower-level dielectric structure 110L' and the upper-level dielectric structure 110U' may include different structures or different materials.

The dielectric structure 110' may include a mufti-layer dielectric material. The dielectric structure 110' may include a seed liner 111 which is positioned on both sidewalls of the pattern structures 105. The dielectric structure 110' may further include a conformal layer 112 formed directly over the seed liner 111. A stack of the seed liner 111 and the conformal layer 112 may be positioned on both sidewalls of the first conductive pattern 102. The stack of the seed liner 111 and the conformal layer 112 may be positioned on both sidewalls of the second conductive pattern 103. Each of the lower-level dielectric structure 110L' and the upper-level dielectric structure 110U' may include the stack of the seed liner 111 and the conformal layer 112.

The seed liner 111 may serve as a seed for depositing the conformal layer 112. The step coverage of the conformal layer 112 may be improved by the seed liner 111. The seed liner 111 may have a thickness of approximately 10 Å or less. The seed liner 111 may be thinner than the conformal layer 112.

The conformal layer 112 may have a first dielectric constant, and the seed liner 111 may have a second dielectric constant. The first dielectric constant may have a lower value than the second dielectric constant. The conformal layer 112 may have a lower dielectric constant than the seed liner 111. The first dielectric constant may be approximately 3.9 or less, and the second dielectric constant may be approximately 7.5. The conformal layer 112 may include a low-k material. The seed liner 111 may have a greater dielectric constant than a low-k material. The conformal layer 112 may have a lower dielectric constant than silicon oxide. The seed liner 111 may include silicon nitride.

The seed liner 111 and the conformal layer 112 may include a silicon-based material. The seed liner 111 may not contain an impurity, and the conformal layer 112 may contain an impurity. As the conformal layer 112 contains an impurity, the dielectric constant of the conformal layer 112 may be lower than that of the seed liner 111. The seed liner 111 may include an impurity-free silicon-based material, and the conformal layer 112 may include an impurity-containing silicon-based material. The conformal layer 112 may include a carbon-containing material, a boron-containing material, or a carbon and boron-containing material. For example, the conformal layer 112 may include carbon, boron, or a combination thereof as an impurity. The impurity-containing silicon-based material may include SiCO, SiCN, SiOCN, SiBN, or SiBCN. The seed liner 111 may include silicon nitride, and the conformal layer 112 may include SiCO, SiCN, SiOCN, SiBN, or SiBCN.

The dielectric structure 110' may further include a first spacer 113, a second spacer 114, and a third spacer 115. The first spacer 113 may be formed over the conformal layer 112. The seed liner 111 and the conformal layer 112 may be positioned between the first spacer 113 and the first conductive pattern 102. The second spacer 114 may be formed over the conformal layer 112, and the third spacer 115 may be formed over the second spacer 114. The seed liner 111 and the conformal layer 112 may be positioned between the second conductive pattern 103 and the second spacer 114, and the second spacer 114 may be disposed between the conformal layer 112 and the third spacer 115.

The lower-level dielectric structure 110L' may include a stack of the seed liner 111, the conformal layer 112, and the first spacer 113. The upper-level dielectric structure 110U' may include a stack of the seed liner 111, the conformal layer 112, the second spacer 114, and the third spacer 115. The first spacer 113 may be thicker than the second spacer 114 and the third spacer 115. The second spacer 114 may be thicker than the third spacer 115. The third spacer 115 may have a lower dielectric constant than the first and second spacers 113 and 114. The conformal layer 112 and the third spacer 115 may have the same dielectric constant. The conformal layer 112 and the third spacer 115 may be formed of the same material. The first spacer 113 and the second spacer 114 may be formed of different materials. The first spacer 113 may include silicon nitride, and the second spacer 114 may include silicon oxide. The third spacer 115 may include a silicon-based material containing impurity. The third spacer 115 may include a carbon-containing material, a boron-containing material, or a carbon and boron-containing material. For example, the third spacer 115 may include carbon, boron, or a combination thereof as an impurity. The impurity-containing silicon-based material may include SiC, SiCO, SiCN, SiOCN, SiBN, or SiBCN.

The lower-level dielectric structure 110L' may include an NKN (Nitride-Low k-Nitride) structure. The NKN structure may be formed of a stack of the seed liner 111, the conformal layer 112, and the first spacer 113. An example of the NKN structure may include a stack of silicon nitride, a low-k material, and silicon nitride. Another example of the NKN structure may include a stack of silicon nitride, an impurity-containing silicon-based material, and silicon nitride. An example of the NKN structure may include a stack of $Si_3N_4/SiCO/Si_3N_4$.

The upper-level dielectric structure 110U' may include an NKOK (Nitride-Low k-Oxide-Low k) structure. The NKOK structure may be formed of a stack of the seed liner 111, the conformal layer 112, the second spacer 114, and the third spacer 115. An example of the NKOK structure may include a stack of silicon nitride, a low-k material, silicon oxide, and a low-k material. Another example of the NKOK structure may include a stack of silicon nitride, an impurity-containing silicon-based material, silicon oxide, an impurity-containing silicon-based material. An example of the NKOK structure may include a stack of $Si_3N_4/SiCO/SiO_2/SiCO$.

Referring to FIG. 4, the semiconductor device 100M may be a part of a memory cell.

In the pattern structures 105, the first conductive pattern 102 may be a bit line contact plug, and the second conductive pattern 103 may include a bit line. The plug structure 120 may include a storage node contact plug.

The dielectric structure 110' may reduce the parasitic capacitance between the first conductive pattern 102 and the plug structure 120. Also, the dielectric structure 110' may reduce the parasitic capacitance between the second conductive pattern 103 and the plug structure 120.

According to another embodiment of the present invention, the first conductive pattern 102 and the second conductive pattern 103 may be gate electrodes of a transistor. The plug structure 120 may be a contact plug coupled to the source/drain regions of the transistor. The dielectric structure 110' may be a gate spacer or a contact spacer. Accordingly, the dielectric structure 110' may reduce the parasitic capacitance between the gate electrode and the contact plug.

According to another embodiment of the present invention, the pattern structures 105 may be line-shaped metal wires. Accordingly, the dielectric structure 110' may reduce the parasitic capacitance between the neighboring metal wires.

Figure 5:
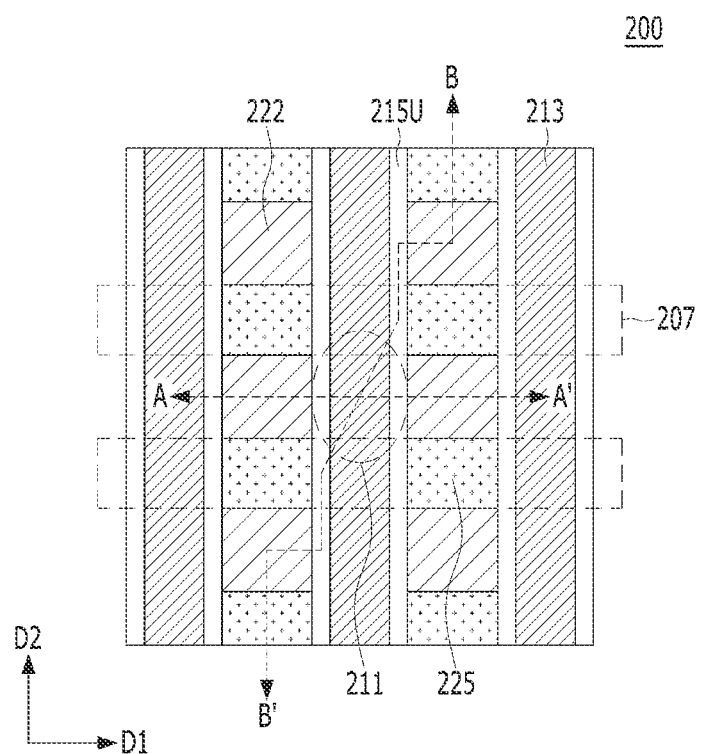
FIG. 5 is a plan view illustrating a semiconductor device in accordance with another embodiment of the present invention.
Figure 6A:
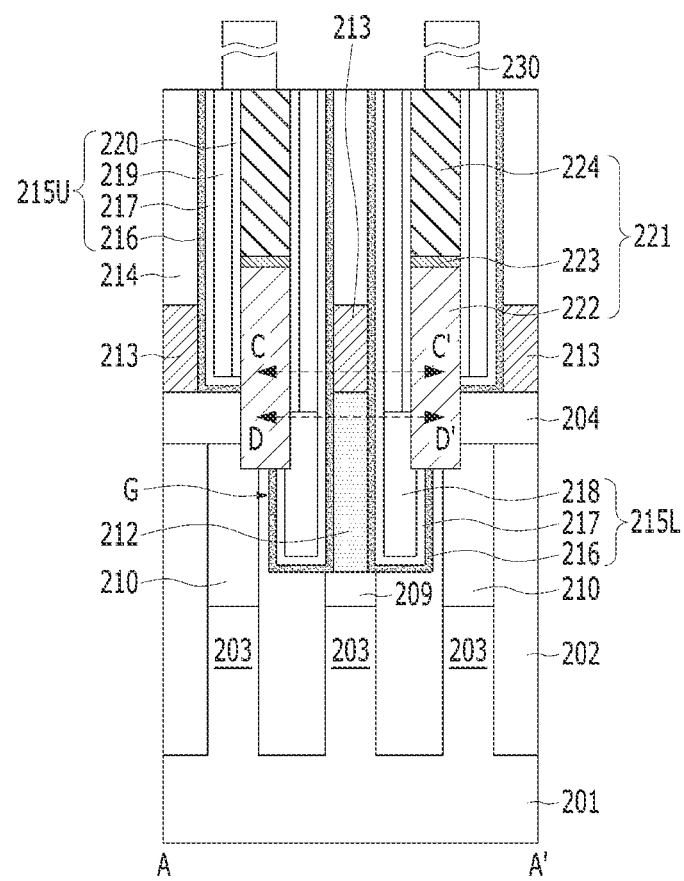
FIG. 6A is a cross-sectional view taken along a line A-A' of FIG. 5.
Figure 6B:
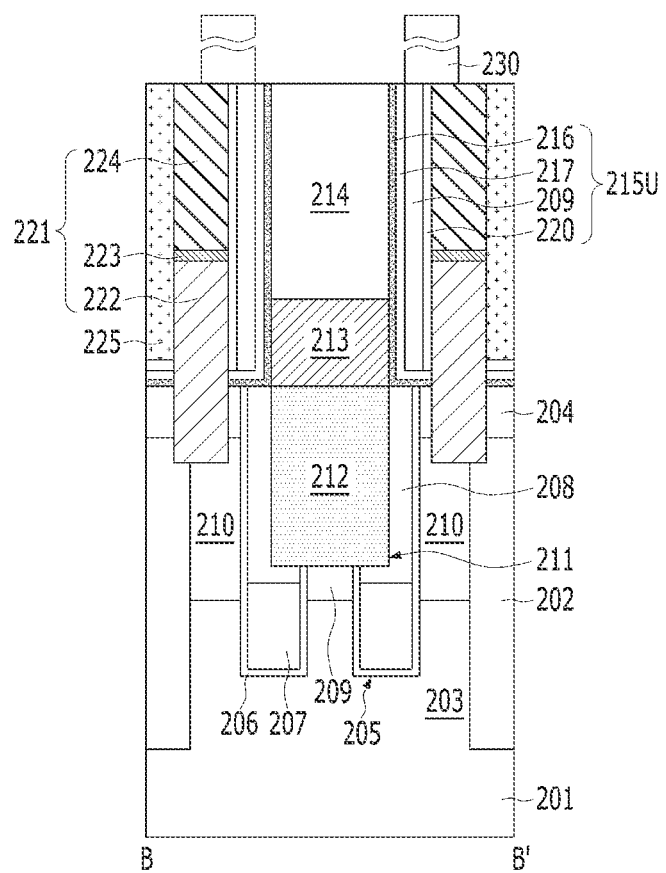
FIG. 6B is a cross-sectional view taken along a line B-B' of FIG. 5.

Referring to FIGS. 3A to 4, the total thickness of the conformal spacer 112 and the second spacer 114 may be greater than the thickness of the seed liner 111, FIG. 5 is a plan view illustrating a semiconductor device 200 in accordance with another embodiment of the present invention, FIG. 6A is a cross-sectional view taken along a line A-A' of FIG. 5. FIG. 6B is a cross-sectional view taken along a line B-B' of FIG. 5.

The semiconductor device 200 may include a plurality of memory cells. Each of the memory cells may include a cell transistor including a buried word line 207, a bit line 213, and a memory element 230.

The semiconductor device 200 will be described in detail.

An isolation layer 202 and an active region 203 may be formed in the substrate 201. A plurality of active regions 203 may be defined by the isolation layer 202. The substrate 201 may be of a material appropriate for semiconductor processing. The substrate 201 may include a semiconductor substrate. The substrate 201 may be formed of a silicon-containing material. The substrate 201 may include silicon, monocrystalline silicon, polysilicon, amorphous silicon, silicon germanium, monocrystalline silicon germanium, polycrystalline silicon germanium, carbon-doped silicon, a combination thereof, or a is multi-layer thereof. The substrate 201 may also include other semiconductor materials, such as germanium. The substrate 201 may include a III/V-group semiconductor substrate, for example, a compound semiconductor substrate, such as GaAs (Gallium arsenide). The substrate 201 may include a Silicon-On-Insulator (SOI) substrate. The isolation layer 202 may be formed by a Shallow Trench Isolation (STI) process.

A gate trench 205 may be formed in the substrate 201. A gate dielectric layer 206 may be formed conformally on the surface of the gate trench 205. A buried word line 207 may be formed over the gate dielectric layer 206 to partially fill the gate trench 205. A gate capping layer 208 may be formed over the buried word line 207 to fill the remainder of the gate trench 205. The top surface of the buried word line 207 may be positioned at a lower level than the top surface of the substrate 201. The buried word line 207 may be a low-resistance metal material. In an embodiment, in the buried word line 207, titanium nitride and tungsten may be sequentially stacked, According to another embodiment of the present invention, the buried word line 207 may be formed of titanium nitride alone (TiN Only). The buried word line 207 may be referred to as a buried gate electrode. The buried word line 207 may extend long in a first direction D1, also referred to as the length direction of the buries word line 207.

First and second impurity regions 209 and 210 may be formed in the substrate 201. The first and second impurity regions 209 and 210 may be spaced apart from each other by the gate trench 205. The first and second impurity regions 209 and 210 may be referred to as source/drain regions. The first and second impurity regions 209 and 210 may contain an N-type impurity, such as arsenic (As) or phosphorus (P). Accordingly, the buried word line 207 and the first and second impurity regions 209 and 210 may become a cell transistor. The cell transistor may exhibit an improved short channel effect by the buried word line 207.

A bit line contact plug 212 may be formed over the substrate 201. The bit line contact plug 212 may be coupled to the first impurity region 209. The bit line contact plug 212 may be positioned in the bit line contact hole 211. The bit line contact hole 211 may penetrate the hard mask layer 204 to extend to the substrate 201, The hard mask layer 204 may be formed over the substrate 201. The hard mask layer 204 may include a dielectric material. The bit line contact hole 211 may expose the first impurity region 209. The lower surface of the bit line contact plug 212 may be lower than the upper surface of the isolation layer 202 and the active region 203. The bit line contact plug 212 may be formed of polysilicon or a metal material. A portion of the bit line contact plug 212 may have a line width smaller than the diameter of the bit line contact hole 211. A bit line 213 may be formed over the bit line contact plug 212 and may be in direct contact with each other. A bit line hard mask 214 may be formed over the bit line 213 and may be in direct contact with each other. The stacked structure of the bit line contact plug 212, the bit line 213, and the bit line hard mask 214 may be referred to as a bit line structure. The bit line 213 may have a line shape extending in a second direction D2 crossing the buried word line 207. A portion of the bit line 213 may be coupled to the bit line contact plug 212. From the perspective of the A-A' direction, the bit line 213 and the bit line contact plug 212 may have the same line width. Accordingly, the is bit line 213 may extend in the second direction D2 while covering the bit line contact plug 212. The bit line 213 may include a metal material, such as tungsten. The bit line hard mask 214 may include a dielectric material.

A first spacer structure 215L may be formed on a sidewall of the bit line contact plug 212. A second spacer structure 215U may be formed on a sidewall of the bit line 213. The first spacer structure 215L may be formed on both sidewalls of the bit line contact plug 212. The second spacer structure 215U may be formed on both sidewalls of the bit line 213. The bit line contact hole 211 may be filled with the bit line contact plug 212 and the first spacer structure 215L. The bit line contact hole 211 may include a gap G defined on both sides of the bit line contact plug 212. The first spacer structure 215L may fill the inside of the gap G. The second spacer structure 215U may extend in parallel to both sidewalls of the bit line 213.

A storage node contact plug 221 may be formed between the neighboring bit line structures. The storage node contact plug 221 may be coupled to the second impurity region 210. The storage node contact plug 221 may include a lower plug 222 and an upper plug 224. The storage node contact plug 221 may further include an ohmic contact layer 223 between the lower plug 222 and the upper plug 224. The ohmic contact layer 223 may include a metal silicide. The lower plug 222 may include a silicon-containing material, for example, such as polysilicon. The upper plug 224 may include a metal-containing material, for example, such as a metal nitride, a metal material, or a combination thereof.

From the perspective of a direction parallel to the bit line structure, a plug isolation layer 225 may be formed between the neighboring storage node contact plugs 221. The plug isolation layer 225 may be formed between the neighboring bit line structures. The neighboring storage node contact plugs 221 may be isolated by the plug isolation layers 225. Between the neighboring bit line structures, a plurality of plug isolation layers 225 and a plurality of storage node contact plugs 221 may be alternately positioned.

A memory element 230 may be formed over the upper plug 224. The memory element 230 may include a capacitor including a storage node. The storage node may include a pillar shape storage node. A dielectric layer and a plate node may be further formed over the storage node. In another embodiment, the storage node may include a cylinder shape storage node.

The first spacer structure 215L and the second spacer structure 215U may be described in detail below.

The first spacer structure 215L may include a seed liner 216, a conformal spacer 217, and a gap-fill spacer 218. The second spacer structure 215U may include the seed liner 216, the conformal spacer 217, a protective spacer 219, and a low-k spacer 220. The seed liner 216 of the first spacer structure 215L and the seed liner 216 of the second spacer structure 215U may be of the same material. The seed liner 216 of the first spacer structure 215L may extend to cover the sidewall of the bit line contact plug 212 while covering the sidewall of the bit line 213. The seed liner 216 may directly contact the bit line 213 and the bit line contact plug 212. The conformal spacer 217 of the first spacer structure 215L and the conformal spacer 217 of the second spacer structure 215U may be of the same material. The conformal spacer 217 may extend to cover the sidewall of the bit line contact plug 212 while covering the sidewall of the bit line 213 with the seed liner 216 interposed between them. The gap-fill spacer 218 may be positioned on the sidewall of the bit line contact plug 212 and may fill the gap G. The protective spacer 219 may be positioned on the sidewall of the bit line 213 and may not be positioned on the sidewall of the bit line contact plug 212. The low-k spacer 220 may be positioned between the protective spacer 219 and the storage node contact plug 221.

The conformal spacer 217 and the low-k spacer 220 may be formed of the same material. The conformal spacer 217 and the low-k spacer 220 may have a dielectric constant of approximately 4.4 or less. The conformal spacer 217 and the low-k spacer 220 may have a lower dielectric constant than the seed liner 216. The conformal spacer 217 and the low-k spacer 220 may have a higher dielectric constant or a lower dielectric constant than the protective spacer 219, The conformal spacer 217 and the low-k spacer 220 may include SiC, SiCO, SiCN, SiOCN, SiBN, or SiBCN. The conformal spacer 217 and the low-k spacer 220 may have a higher dielectric constant than silicon nitride, but may include different low-k materials.

The seed liner 216 may include silicon nitride and may have a thickness of approximately 20 Å or less. In an embodiment, the seed liner 216 may have a thickness of approximately 1 to approximately 20 Å. In other words, the seed liner 216 may include ultra-thin silicon nitride, meaning a seed liner 216 made of silicon nitride and having a thickness of from approximately 1 to approximately 20 Å. The seed liner 216 may be thinner than the conformal spacer 217. For example, the conformal spacer 217 may be twice as thick as the seed liner 216. The seed liner 216 may be thinner than the protective spacer 219 and the low-k spacer 220. According to another embodiment of the present invention, the total thickness of the conformal spacer 217 and the protective spacer 219 may be greater than the thickness of the seed liner 216.

The seed liner 216 may serve as a seed for uniform deposition of the conformal spacer 217. The conformal spacer 217 and the seed liner 216 may directly contact each other. The protective spacer 219 may serve to protect the conformal spacer 217. The seed liner 216 may also be referred to as a surface liner. Since the seed liner 216 is thin, the volume occupied by the seed liner 216 in the second spacer structure 215U may be minimized, and accordingly, the parasitic capacitance between the bit line 213 and the storage node contact plug 221 may be further reduced.

As described above, the seed liner 216, the conformal spacer 217, and the gap-fill spacer 218 may be positioned between the bit line contact plug 212 and the storage node contact plug 221. The seed liner 216, the conformal spacer 217, the protective spacer 219, and the low-k spacer 220 may be positioned between the bit line 213 and the storage node contact plug 221.

The seed liner 216 and the gap-fill spacer 218 may include silicon nitride, and the conformal spacer 217 and the low-k spacer 220 may include a low-k material. The protective spacer 219 may include silicon oxide. Accordingly, the second spacer structure 215U may have an NKOK structure and may be provided between the bit line 213 and the storage node contact plug 221 along the C-C' line, and the first spacer structure 215L having an NKN structure may be provided between the bit line contact plug 212 and the storage node contact plug 221 along the D-D' line.

According to another embodiment of the present invention, the is protective spacer 219 may be replaced with an air gap. In this case, the second spacer structure 215U having a NKAK (Nitride-Low k-Air gap-Low k) structure may be provided between the bit line 213 and the storage node contact plug 221 along the C-C' line. The first spacer structure 215L having an NKN structure may be provided between the bit line contact plug 212 and the storage node contact plug 221 along the line D-D'.

The parasitic capacitance between the bit line 213 and the storage node contact plug 221 may be reduced by the conformal spacer 217 and the low-k spacer 220. The step coverage of the conformal spacer 217 may be improved by the seed liner 216. The loss of the conformal spacer 217 may be prevented by the protective spacer 219.

The plug isolation layer 225 may include silicon nitride or a low-k material. When the plug isolation layer 225 includes a low-k material, parasitic capacitance between the neighboring storage node contact plugs 221 with the plug isolation layer 225 interposed therebetween may be reduced. The plug isolation layer 225 may include SiC, SiCO, SiCN, SiOCN, SiBN, or SiBCN. The conformal spacer 217, the low-k spacer 220, and the plug isolation layer 225 may include a low-k material. The plug isolation layer 225 may include a low-k material which is different from those of the conformal spacer 217 and the low-k spacer 220. For example, the conformal spacer 217 and the low-k spacer 220 may include a carbon-containing low-k material, and the plug isolation layer 225 may include a boron-containing low-k material. The conformal spacer 217 and the low-k spacer 220 may include SiC, SiCO, SiCN or SiOCN, and the plug isolation layer 225 may include SiBN or SiBCN.

Referring to FIGS. 5 to 6B, since the conformal spacer 217 is formed over the thin seed liner 216, the step coverage of the conformal spacer 217 may be improved. Since the thickness of the seed liner 216 occupying in the first and second spacer structures 215L and 215U is reduced, parasitic capacitance may be suppressed from being increased. By forming the conformal spacer 217 between the bit line contact plug 212 and the storage node contact plug 221, the parasitic capacitance between the bit line contact plug 212 and the storage node contact plug 221 may be reduced. By forming the conformal spacer 217 and the low-k spacer 220 between the bit line 213 and the storage node contact plug 221, the parasitic capacitance between the bit line 213 and the storage node contact plug 221 may be reduced.

As described above, since the parasitic capacitance is reduced by the first spacer structure 215L and the second spacer structure 215U including low-k materials such as the conformal spacer 217 and the low-k spacer 220, the sensing margin of a memory cell may be improved.

Figure 6C:
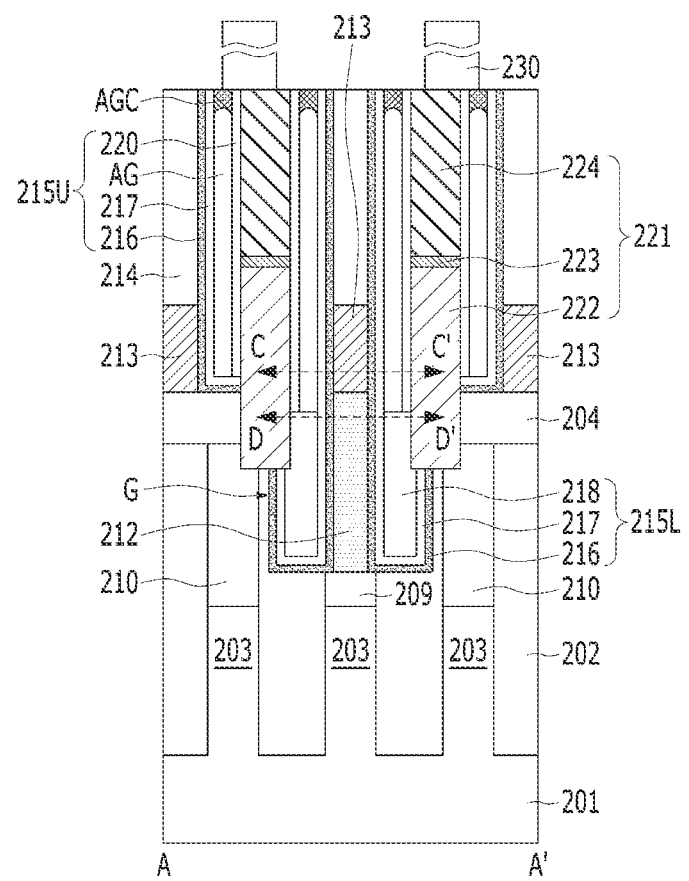
FIG. 6C illustrates a modified example of a second spacer structure 215U shown in FIG. 6A.

According to another embodiment of the present invention, as illustrated in FIG. 6C, the protective spacer 219 may be replaced with an air gap.

FIG. 6C is a cross-sectional view illustrating a modified example of the second spacer structure 215U shown in FIG. 6A. The second spacer structure 215U may include a seed liner 216, a conformal spacer 217, an air gap AG, and a low-k spacer 220. The air gap AG may be formed by removing the protective spacer 219 shown in FIG. 6A, and an upper portion of the air gap AG may be covered with an air gap capping layer AGC. In this case, the second spacer structure 215U having an NKAK (Nitride-Low k-Air gap- Low k) structure may be provided between the bit line 213 according to a line C-C' and the storage node contact plug 221. Also, the first spacer structure 215L having an NKN structure may be provided between the bit line contact plug 212 according to a line D-D' and the storage node contact plug 221. The NKAK structure may have a greater effect of reducing parasitic capacitance than an NKOK structure.

FIGS. 7 to 19 are cross-sectional views illustrating a method for fabricating a semiconductor device 200 in accordance with an embodiment of the present invention. FIGS. 7 to 19 are cross-sectional views illustrating a fabrication method taken along lines A-A' and B-B' of FIG. 5.

Figure 7:
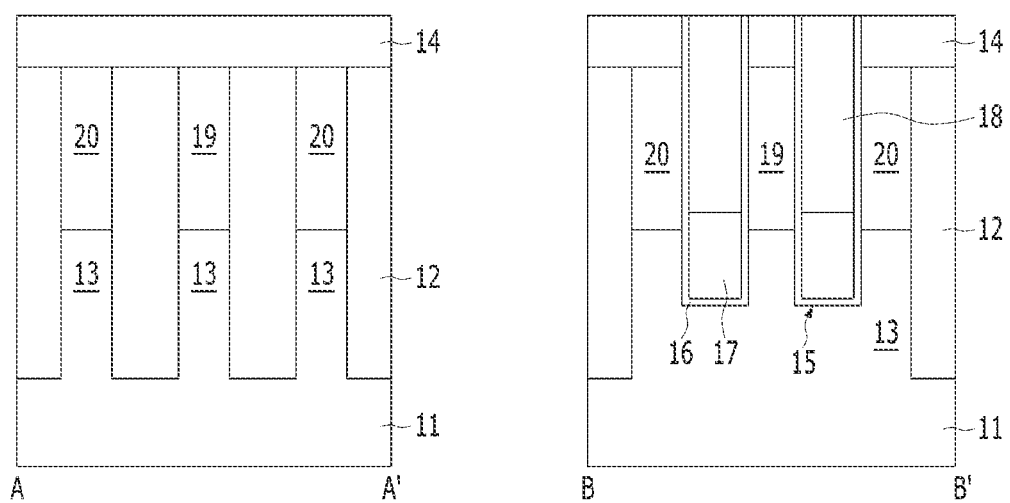
FIGS. 7 to 19 are cross-sectional views illustrating a method for fabricating a semiconductor device in accordance with an embodiment of the present invention.

Referring to FIG. 7, an isolation layer 12 may be formed in the substrate 11. A plurality of active regions 13 may be defined by the isolation layer 12. The isolation layer 12 may be formed by an STI process. The STI process may be performed as follows. The substrate 11 may be etched to form an isolation trench. The isolation trench may be filled with a dielectric material. As a result, an isolation layer 12 may be formed. The isolation layer 12 may include a dielectric material, for example silicon oxide, silicon nitride, or a combination thereof. Chemical vapor deposition (CVD) or other deposition processes may be performed to fill the isolation trench with the dielectric material. A planarization process such as Chemical-Mechanical Polishing (CMP) may additionally be used.

Subsequently, a buried word line structure may be formed in the substrate 11. The buried word line structure may include a gate trench 15, a gate dielectric layer 16 covering conformally the bottom and sidewall of the gate trench 15, a buried word line 17 partially filling the gate trench 15 over the gate dielectric layer 16, and a gate capping layer 18 formed over the buried word line 17.

The method of forming the buried word line structure is as follows.

First, the gate trench 15 may be formed in the substrate 11. The gate trench 15 may have a line shape crossing the active regions 13 and the isolation layer 12. The gate trench 15 may be formed by an etching process by forming a mask pattern over the substrate 11 and using the mask pattern as an etching mask. To form the gate trench 15, the hard mask layer 14 may be used as an etch barrier. The hard mask layer 14 may have a shape that is patterned by a mask pattern. The hard mask layer 14 may include silicon oxide. The hard mask layer 14 may, for example, include Tetra Ethyl Ortho Silicate (TEOS). The bottom surface of the gate trench 15 may be positioned at a higher level than the bottom surface of the isolation layer 12.

A portion of the isolation layer 12 may be recessed to protrude the active region 13 below the gate trench 15. For example, in the direction B-B' of FIG. 5, the isolation layer 12 below the gate trench 15 may be selectively recessed. Accordingly, a fin region may be formed below the gate trench 15. The fin region may be a portion of a channel region.

Subsequently, a gate dielectric layer 16 may be formed over the bottom surface and sidewall of the gate trench 15. Before the gate dielectric layer 16 is formed, etching damage on the surface of the gate trench 15 may be recovered. For example, after the sacrificial oxide is formed by a thermal oxidation process, the sacrificial oxide may be removed.

The gate dielectric layer 16 may be formed by a thermal oxidation process. For example, the gate dielectric layer 16 may be formed by oxidizing the bottom and sidewall of the gate trench 15.

According to another embodiment of the present invention, the gate dielectric layer 16 may be formed by a deposition method, such as Chemical Vapor Deposition (CVD) or Atomic Layer Deposition (ALD). The gate dielectric layer 16 may include a high-k material, an oxide, a nitride, an oxynitride, or a combination thereof. The high-k material may include a hafnium-containing material. The hafnium-containing material may include hafnium oxide, hafnium silicon oxide, hafnium silicon oxynitride, or a combination thereof. According to another embodiment of the present invention, the high-k material may include lanthanum oxide, lanthanum aluminum oxide, zirconium oxide, zirconium silicon oxide, zirconium silicon oxynitride, aluminum oxide, and combinations thereof.

According to another embodiment of the present invention, the gate dielectric layer 16 may be formed by depositing a liner polysilicon layer and then radically oxidizing the liner polysilicon layer.

According to yet another embodiment of the present invention, the gate dielectric layer 16 may be formed by forming a liner silicon nitride layer and radically oxidizing the liner silicon nitride layer.

Subsequently, a buried word line 17 may be formed over the gate dielectric layer 16. To form the buried word line 17, a recessing process may be performed after forming a conductive layer to fill the gate trench 15. An etch-back process may be performed as the recessing process, or a Chemical Mechanical Polishing (CMP) process and an etch-back process may be sequentially performed. The buried word line 17 may have a recessed shape that partially fills the gate trench 15. In other words, the upper surface of the buried word line 17 may be positioned at a lower level than the upper surface of the active region 13. The buried word line 17 may include a metal, a metal nitride, or a combination thereof. For example, the buried word line 17 may be formed of titanium nitride (TiN), tungsten (W), or a stack of titanium nitride and tungsten (TiN/W). The titanium nitride/tungsten (TiN/W) stack may have a structure in which the gate trench 15 is partially filled with tungsten after conformally forming titanium nitride. As the buried word line 17 may include titanium nitride alone, and this may be referred to as a buried word line 17 having a 'TiN Only' structure. The buried word line 17 may include a double gate structure of a titanium nitride/tungsten (TiN/W) stack and a polysilicon layer.

Subsequently, a gate capping layer 18 may be formed over the buried word line 17. The gate capping layer 18 may include a dielectric material. The rest of the gate trench 15 may be filled with the gate capping layer 18 over the buried word line 17. The gate capping layer 18 may include silicon nitride. According to another embodiment of the present invention, the gate capping layer 18 may include silicon oxide. According to yet another embodiment of the present invention, the gate capping layer 18 may have a NON (Nitride-Oxide-Nitride) structure. The upper surface of the gate capping layer 18 may be positioned at the same level as the upper surface of the hard mask layer 14. To this end, a CMP process may be performed when the gate capping layer 18 is formed.

After the gate capping layer 18 is formed, impurity regions 19 and 20 may be formed. The impurity regions 19 and 20 may be formed by a doping process, such as, for example, an implantation is process. The impurity regions 19 and 20 may include a first impurity region 19 and a second impurity region 20. The first and second impurity regions 19 and 20 may be doped with impurities of the same conductivity type. The first and second impurity regions 19 and 20 may have the same depth. According to another embodiment of the present invention, the first impurity region 19 may be deeper than the second impurity region 20. The first and second impurity regions 19 and 20 may be referred to as source/drain regions. The first impurity region 19 may be a region to be coupled to a bit line contact plug, and the second impurity region 20 may be a region to be coupled to a storage node contact plug. The first impurity region 19 and the second impurity region 20 may be positioned in different active regions 13. Also, the first impurity region 19 and the second impurity region 20 may be spaced apart from each other by the gate trenches 15 to be positioned in each of the active regions 13.

A cell transistor of a memory cell may be formed by the buried word line 17 and the first and second impurity regions 19 and 20.

Figure 8:
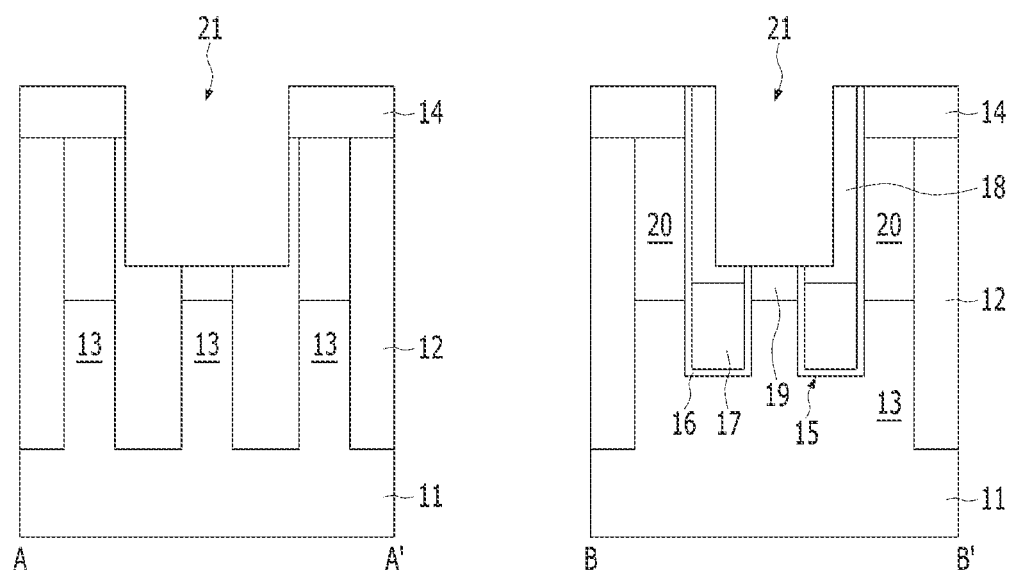

Referring to FIG. 8, a bit line contact hole 21 may be formed. The bit line contact hole 21 may be formed by etching the hard mask layer 14 by using a contact mask. The bit line contact hole 21 may have a circular shape or an elliptic shape from the perspective of a plan view. A portion of the substrate 11 may be exposed by the bit line contact hole 21. The bit line contact hole 21 may have a diameter which is controlled by a predetermined line width. The bit line contact hole 21 may have a shape exposing a portion of the active region 13. For example, the first impurity region 19 may be exposed by the bit line contact hole 21. The bit line contact hole 21 may have a diameter greater than the width of the short axis of the active region 13. Accordingly, in an etching process for forming the bit line contact hole 21, the first impurity region 19, the isolation layer 12, and a portion of the gate capping layer 18 may be etched. In other words, the gate capping layer 18, the first impurity region 19, and the isolation layer 12 below the bit line contact hole 21 may be recessed to a predetermined depth. Accordingly, the bottom of the bit line contact hole 21 may extend into the inside of the substrate 11. As the bit line contact hole 21 extends, the surface of the first impurity region 19 may be recessed, and the surface of the first impurity region 19 may be positioned at a lower level than the upper surface of the active region 13 as indicated by the upper surface of the second impurity region 20.

Figure 9:
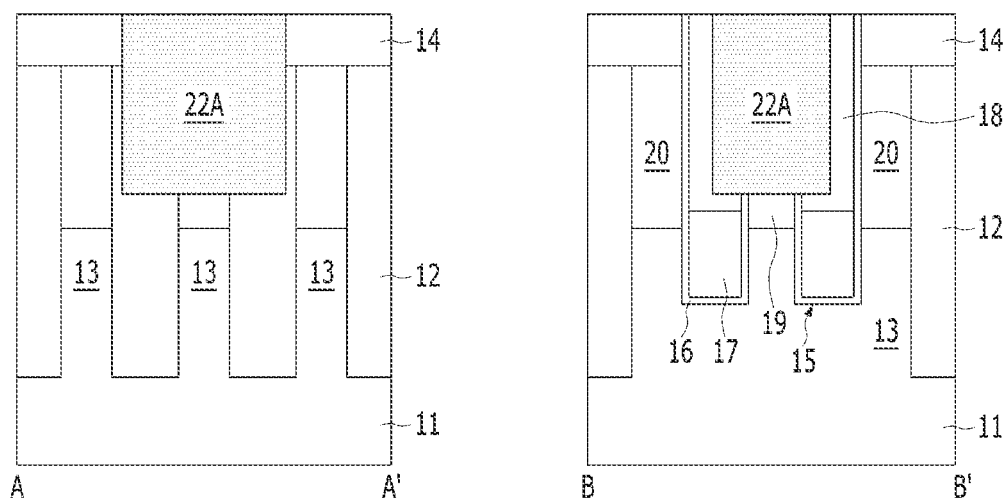

Referring to FIG. 9, a pre-plug 22A may be formed. The pre-plug 22A may be formed by a Selective Epitaxial Growth (SEG) process. For example, the pre-plug 22A may include SEG silicon phosphorus (SiP). In this way, the pre-plug 22A may be formed without voids by the selective epitaxial growth process. According to another embodiment of the present invention, the pre-plug 22A may be formed by deposition of a polysilicon layer followed by a Chemical Mechanical Polishing (CMP) process. The pre-plug 22A may fill the bit line contact hole 21. The upper surface of the pre-plug 22A may be positioned at the same level as the upper surface of the hard mask layer 14.

Figure 10:
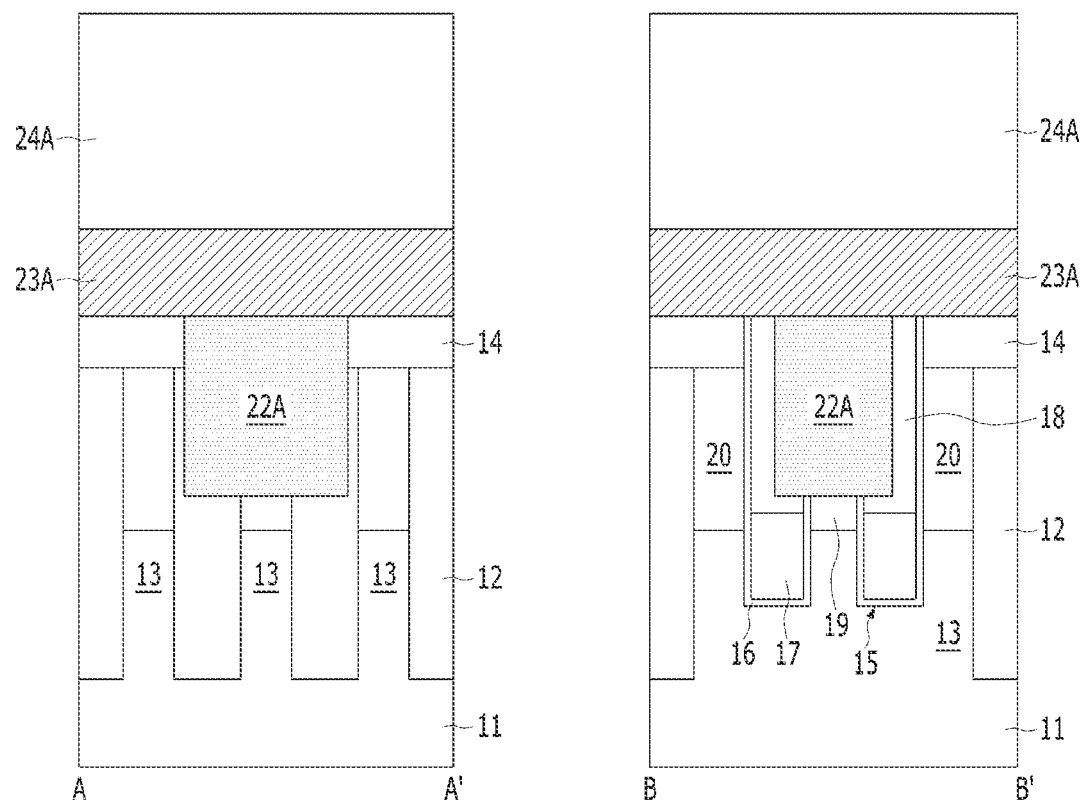

Referring to FIG. 10, a bit line conductive layer 23A and a bit line hard mask layer 24A may be stacked. The bit line conductive layer 23A and the bit line hard mask layer 24A may be sequentially stacked over the pre-plug 22A and the hard mask layer 14. The bit line conductive layer 23A may include a metal-containing material. The bit line conductive layer 23A may include a metal, a metal nitride, a metal silicide, or a combination thereof. According to an embodiment of the present invention, the bit line conductive layer 23A may include tungsten (W). According to another embodiment of the present invention, the bit line conductive layer 23A may include a stack of titanium nitride and tungsten (TiN/W), Herein, the titanium nitride may serve as a barrier. The bit line hard mask layer 24A may be formed of a dielectric material having an etch selectivity with respect to the bit line conductive layer 23A and the pre-plug 22A. The bit line hard mask layer 24A may include silicon oxide or silicon nitride. According to an embodiment of the present invention, the bit line hard mask layer 24A may be formed of silicon nitride.

Figure 11:
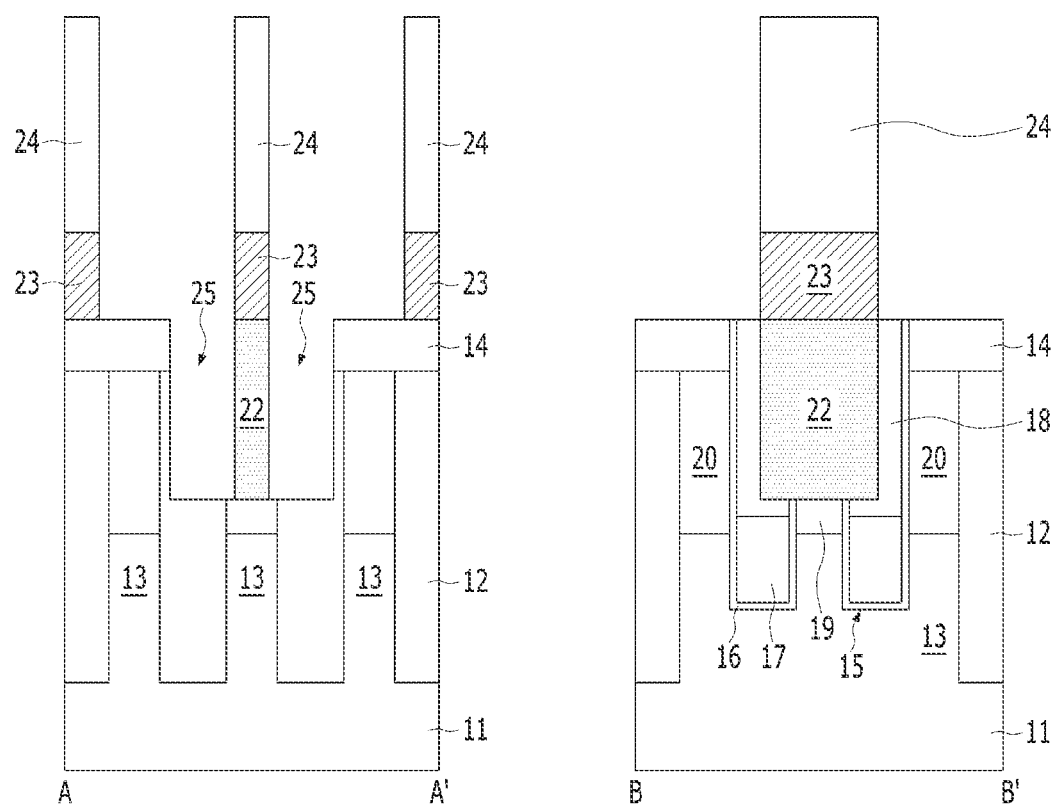

Referring to FIG. 11, a bit line 23 and a bit line contact plug 22 may be formed. The bit line 23 and the bit line contact plug 22 may be formed by an etching process using a bit line mask layer.

The bit line hard mask layer 24A and the bit line conductive layer 23A may be etched by using the bit line mask layer as an etch barrier. Accordingly, the bit line 23 and the bit line hard mask 24 may be formed. The bit line 23 may be formed by etching the bit line conductive layer 23A. The bit line hard mask 24 may be formed by etching the bit line hard mask layer 24A.

Subsequently, the pre-plug 22A may be etched with the same line width as that of the bit line 23. Accordingly, the bit line contact plug 22 may be formed. The bit line contact plug 22 may be formed over the first impurity region 19. The bit line contact plug 22 may couple the first impurity region 19 and the bit line 23 to each other. The bit line contact plug 22 may be formed in the bit line contact hole 21. The line width of the bit line contact plug 22 may be smaller than the diameter of the bit line contact hole 21. Accordingly, gaps 25 may be defined on both sides of the bit line contact plug 22.

As described above, as the bit line contact plug 22 is formed, the gaps 25 may be formed in the bit line contact hole 21. This is because the bit line contact plug 22 is formed by being etched to be smaller than the diameter of the bit line contact hole 21. The gaps 25 may not have a surround shape surrounding the bit line contact plug 22, but may be formed independently on both sidewalls of the bit line contact plug 22. As a result, one bit line contact plug 22 and a pair of gaps 25 may be positioned in the bit line contact hole 21, and the pair of gaps G may be separated by the bit line contact plug 22. The bottom surface of the gaps 25 may extend into the inside of the isolation layer 12. The lower surface of the gaps 25 may be positioned at a lower level than the recessed upper surface of the first impurity region 19.

A structure in which the bit line contact plug 22, the bit line 23, and the bit line hard mask 24 are stacked in the mentioned order may be referred to as a bit line structure. From the perspective of a top view, the bit line structure may be a line-shaped pattern structure that extends long in one direction.

Figure 12:
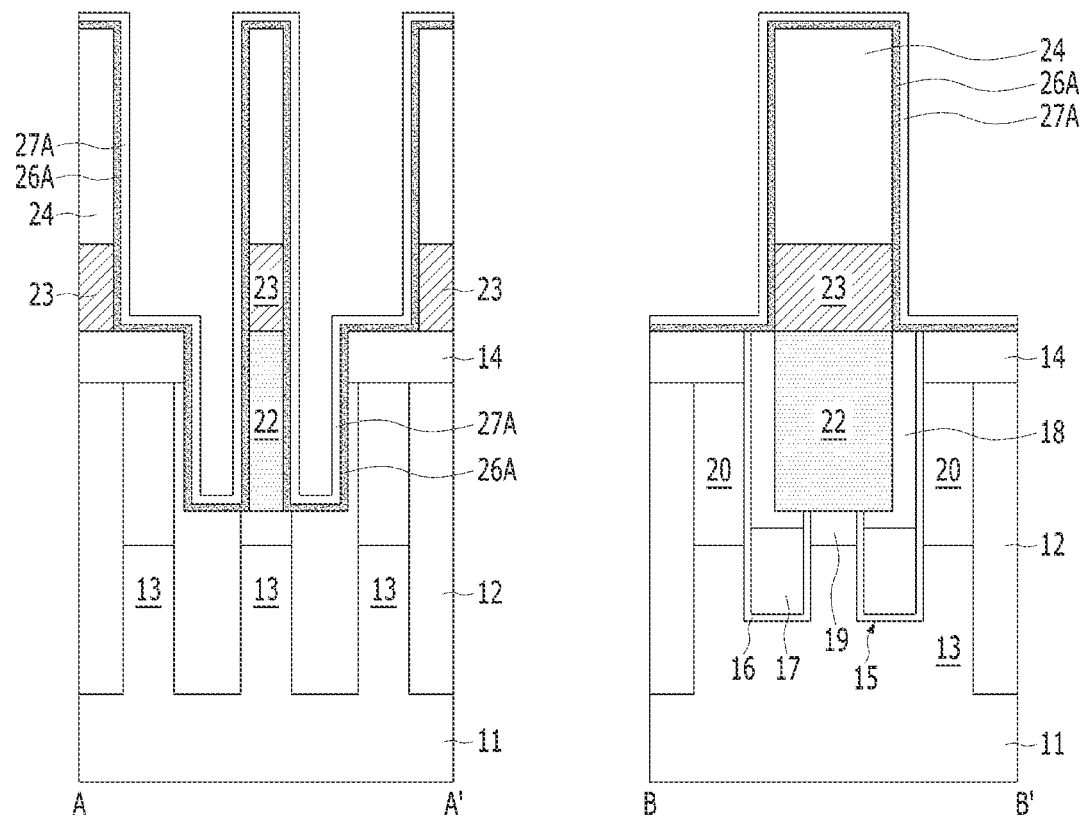

Referring to FIG. 12, a seed layer 26A and a conformal layer 27A may be sequentially formed. The seed layer 26A may cover both sidewalls of the bit line contact plug 22 and both sidewalls of the bit line 23. The seed layer 26A may cover both sidewalls and the upper surface of the bit line hard mask 24. The seed layer 26A may provide uniform deposition of the conformal layer 27A, thereby improving step coverage of the conformal layer 27A. The seed layer 26A may include a passivation material capable of inhibiting oxidation of the bit is line 23. The seed layer 26A may include a dielectric material. According to an embodiment of the present invention, for example, the seed layer 26A may include silicon nitride. The seed layer 26A may include thin silicon nitride, and the thin silicon nitride may be formed to have a thickness of approximately 10 Å or less, for example, from approximately 1 to approximately 10 Å. In this way, by applying a thin silicon nitride as the seed layer 26A, the parasitic capacitance between the bit line 23 and the subsequent storage node contact plug may be reduced.

The conformal layer 27A may have a lower dielectric constant than the seed layer 26A. The conformal layer 27A may include a low-k material, and the conformal layer 27A may have a dielectric constant which is lower than those of silicon nitride and silicon oxide. The conformal layer 27A may have a dielectric constant of approximately 3.5 or less. The conformal layer 27A may include a silicon-based material. The conformal layer 27A may include at least one chemical species selected among carbon and boron. The conformal layer 27A may include a carbon-containing silicon-based material, a boron-containing silicon-based material, or a carbon and boron-containing silicon-based material. The conformal layer 27A may include a carbon-doped silicon-based material or a boron-doped silicon-based material. The conformal layer 27A may include SIC, SiCO, SiCN, SiOCN, SiBN, or SiBCN.

The conformal layer 27A may be formed, for example, by Atomic Layer Deposition (ALD). For example, the conformal layer 26A may be formed by SiBN ALD or SiCO ALD. SiBN ALD may include a unit cycle of 'SiH$_2$Cl$_2$ (or SiH$_4$)/purge/BCl$_3$/purge/NH$_3$/purge', SiCO ALD may include a unit cycle of 'SiH$_2$Cl$_2$ (or SiH$_4$)/purge/C$_2$H$_4$ (or CH$_4$)/purge/O$_3$/purge'. SiH$_2$Cl$_2$ and SiH$_4$ are silicon source gases, and BCl$_3$ is a boron source gas. NH$_3$ is a nitrogen source gas, and O$_3$ is an oxygen source gas. The silicon source gas, boron source gas, nitrogen source gas, and oxygen source gas may include other source materials except for the above-described source materials.

Figure 13:
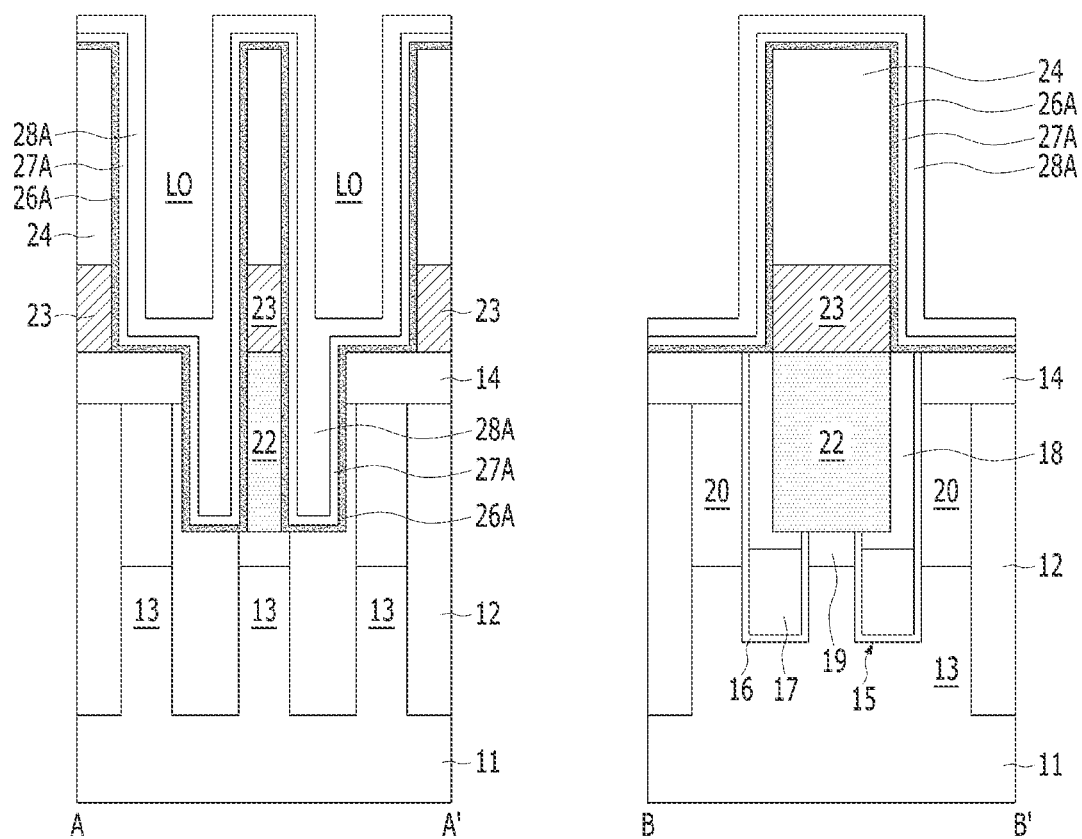
Figure 14:
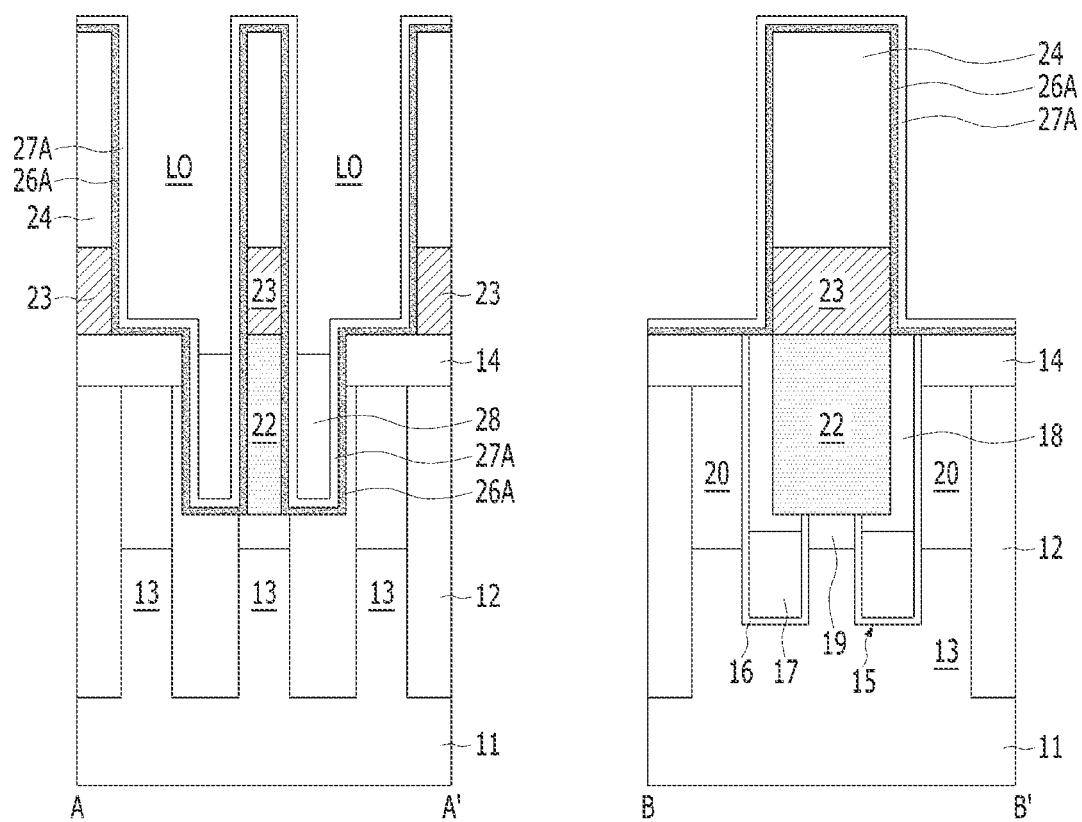

Referring to FIGS. 13 and 14, a gap-fill spacer 28 may be formed. The gap-fill spacer 28 may be formed over the conformal layer 27A. The conformal layer 27A may have a lower dielectric constant than the gap-fill spacer 28. The gap-fill spacer 28 and the seed layer 26A may be formed of the same material, but the gap-fill spacer 28 may be thicker than the seed layer 26A. The gap-fill spacer 28 may include silicon nitride.

The gap-fill spacer 28 may be recessed to fill the gaps 25. For example, in order to form the gap-fill spacer 28, a gap-fill material 28A may be deposited over the bit line structure and the conformal layer 27A to fill the gaps 25, and then the gap-fill material 28A may be recessed by an etch-back process. The upper surface of the gap-fill spacer 28 may be positioned at a lower level than the upper surface of the bit line contact plug 22. According to another embodiment of the present invention, the upper surface of the gap-fill spacer 28 and the upper surface of the bit line contact plug 22 may be positioned at the same level. The gap-fill material 28A may include silicon nitride.

The gaps 25 may be filled with the seed layer 26A, the conformal layer 27A, and the gap-fill spacer 28. The gap-fill spacer 28 may be referred to as a dielectric plug or a plugging spacer. According to another embodiment of the present invention, the gap-fill spacer 28 may be formed of silicon oxide or a low-k material.

After the gap-fill spacer 28 is formed, a line-shaped opening LO may be defined between the neighboring bit lines 23.

Figure 15:
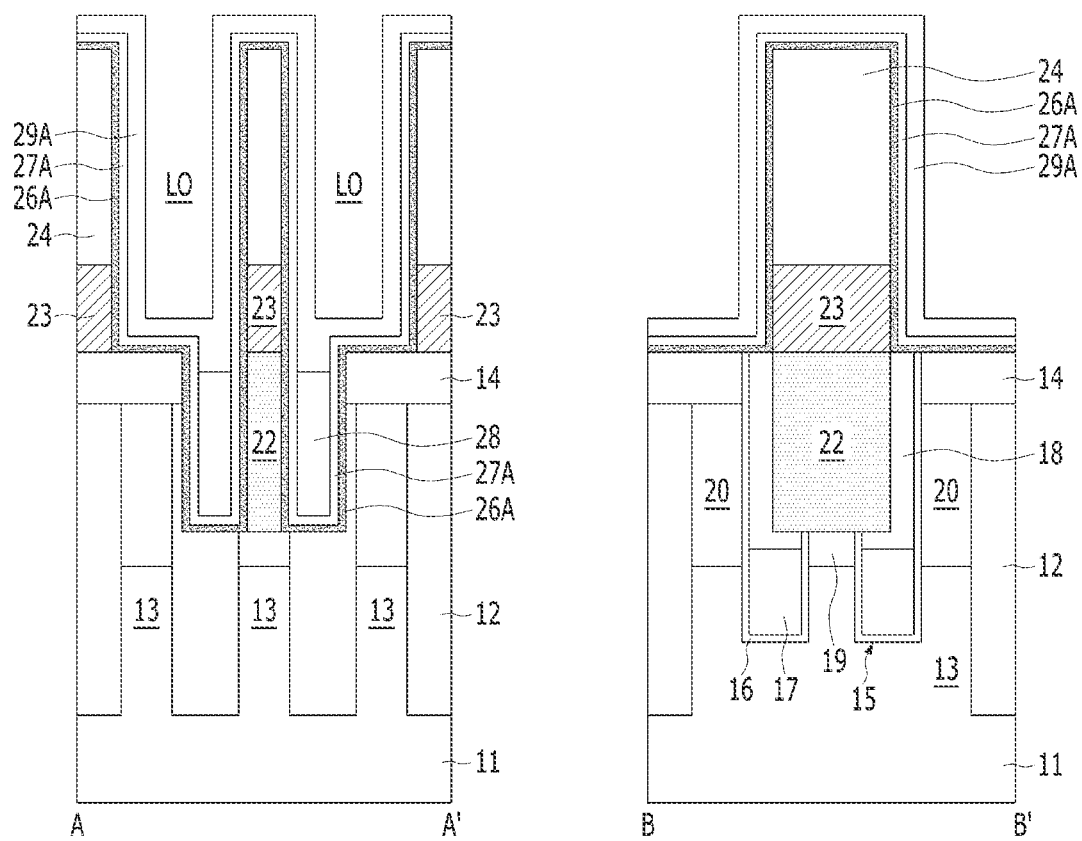
Figure 16:
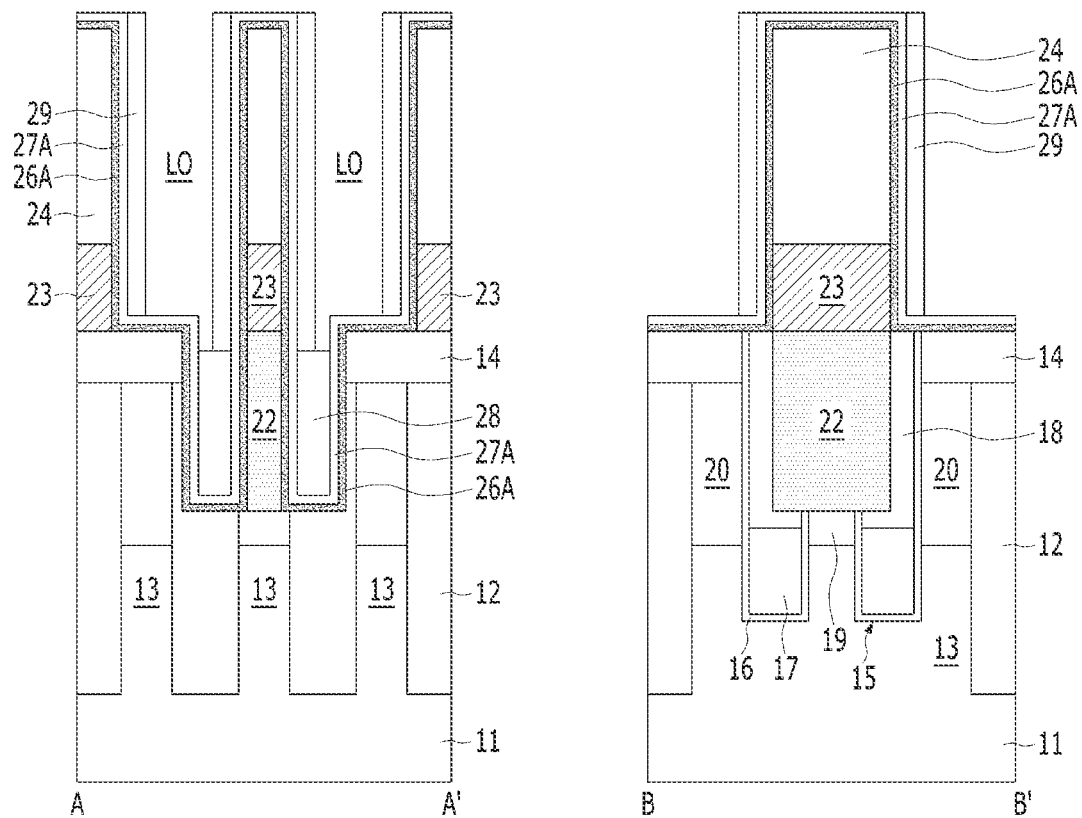

Referring to FIGS. 15 and 16, a protective spacer 29 may be formed over the gap-fill spacer 28. The protective spacer 29 may have a line shape extending long along both sidewalls of the bit line structure. The protective spacer 29 may directly contact the upper surface of the gap-fill spacer 28. The protective spacer 29 may directly contact the conformal layer 27A. The protective spacer 29 may have a lower dielectric constant than the gap-fill spacer 28 and the seed layer 26A, and the protective spacer 29 may have a smaller or greater dielectric constant than the conformal layer 27A. The protective spacer 29 may be thicker than the conformal layer 27A. The protective spacer 29 may include silicon oxide. The protective spacer 29 may have an etch selectivity with respect to the conformal layer 27A.

In order to form the protective spacer 29, an etch-back process may be performed after a protective material 29A is deposited over the gap-fill spacer 28 and the bit line structure. The protective material 29A may include silicon oxide. The bottom surface of the protective spacer 29 may be positioned at a lower level than the lower surface of the bit line 23. The upper surface of the protective spacer 29 may be positioned at a higher level than the upper surface of the bit line hard mask 24. The total thickness of the protective spacer 29 and the conformal layer 27A may be greater than the thickness of the seed layer 26A.

The protective spacer 29 may prevent the conformal layer 27A from being damaged on both sidewalls of the bit line 23 during a subsequent process.

Figure 17:
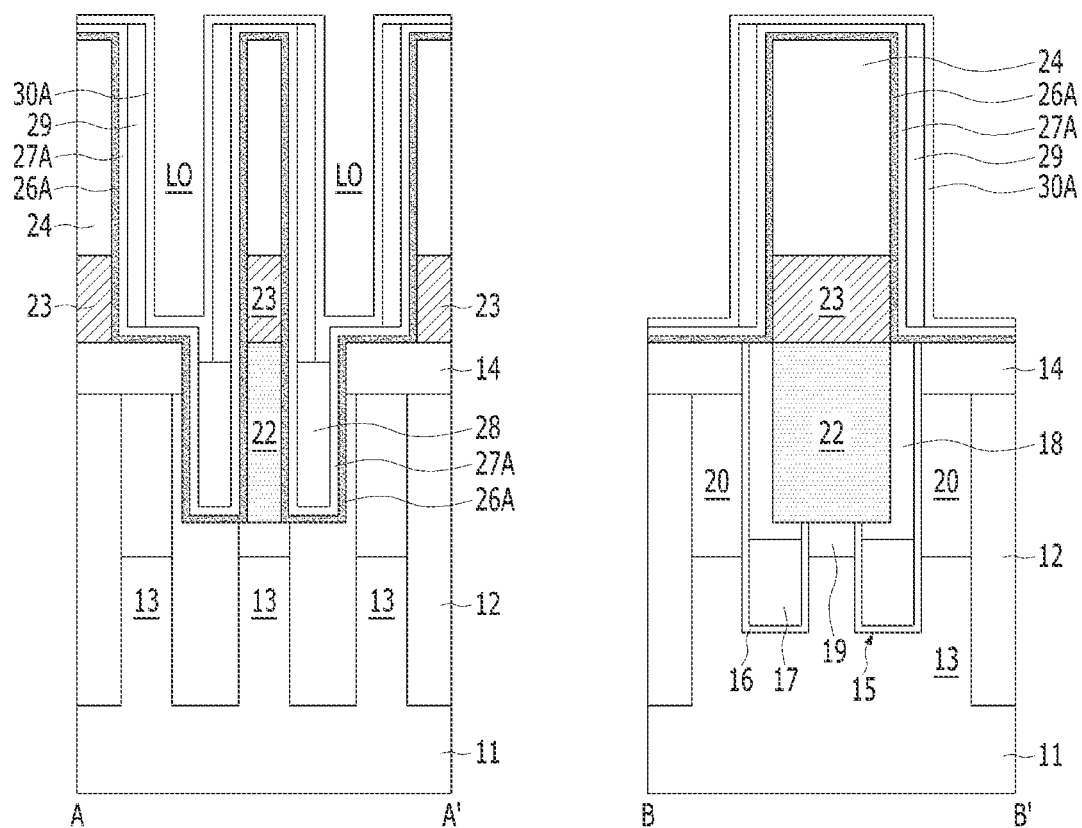

Referring to FIG. 17, a low-k spacer layer 30A may be formed conformally over the protective spacer 29. The low-k spacer layer 30A may have a lower dielectric constant than the seed layer 26A, The low-k spacer layer 30A may have the same dielectric constant as that of the conformal layer 27A. The low-k spacer layer 30A and the conformal layer 27A may be formed of the same material. The low-k spacer layer 30A may include a low-k material, and the low-k spacer layer 30A may have a lower dielectric constant than silicon nitride. The low-k spacer layer 30A may have a dielectric constant of approximately 4.4 or less. The low-k spacer layer 30A may include a silicon-based material. The low-k spacer layer 30A may include at least one chemical species selected among carbon and boron. The low-k spacer layer 30A may include a carbon-doped silicon-based material or a boron-doped silicon-based material. The low-k spacer layer 30A may include SiC, SiCO, SiCN, SiOCN, SiBN, or SiBCN.

The low-k spacer layer 30A may be formed, for example, by Atomic Layer Deposition (ALD). Since the protective spacer 29 and the low-k spacer layer 30A are sequentially formed over the conformal layer 27A having improved step coverage, the step coverage of the low-k spacer layer 30A may also be improved. According to another embodiment of the present invention, the low-k spacer layer 30A may have a worse step coverage than the conformal layer 27A.

Figure 18:
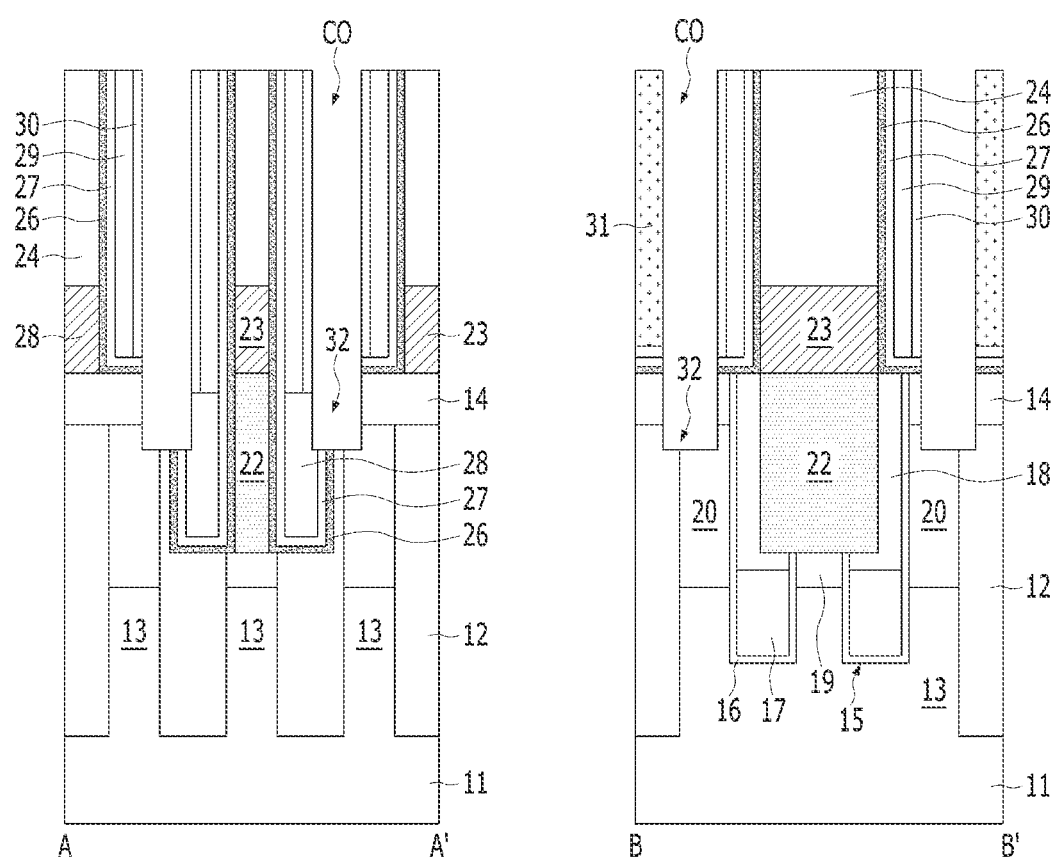

Referring to FIG. 18, a plurality of plug isolation layers 31 may be formed over the low-k spacer layer 30A. The plug isolation layers 31 may separate the line-type openings LO between the bit line structures into a plurality of contact openings CO, Referring to FIG. 5, in the direction A-A', the plug isolation layers 31 may vertically overlap with the buried word line 17 over the buried word lines 17, respectively. The plug isolation layers 31 may include silicon nitride or a low-k material. According to another embodiment of the present invention, the plug isolation layers 31 may include a boron-containing low-k material, and the conformal layer 27A and the low-k spacer layer 30A may include a carbon-containing low-k material. According to another embodiment of the present invention, while forming the plug isolation layers 31, a portion of the bit line hard mask 24 may be consumed. In order to form the plug isolation layers 31, a sacrificial material such as an oxide filling between the bit line structures may be formed over the low-k spacer layer 30A, and a portion of the sacrificial material may be replaced with the plug isolation layers 31. Subsequently, a plurality of contact openings CO may be formed between the plug isolation layers 31 by removing the remaining sacrificial material.

Referring to FIG. 5, from the perspective of a top view, in the direction that the bit line 23 extends, the contact openings CO and the plug isolation layers 31 may be alternately formed between the neighboring bit lines 23. The neighboring contact openings CO may be arranged in an isolated shape by the bit line structure and the plug isolation layers 31. From the perspective of a top view, the contact opening CO may have a rectangular hole shape.

The lower materials may be etched to be self-aligned to the contact openings CO. Accordingly, a plurality of recess regions 32 exposing a portion of the active region 13 may be formed between the bit line structures. Anisotropic etching or a combination of anisotropic etching and isotropic etching may be used to form the recess regions 32. For example, among the structures exposed through the contact openings CO between bit line structures, the low-k spacer layer 30A, the conformal layer 27A, and the seed layer 26A may be anisotropically etched sequentially. Then, a portion of the active region 13 exposed afterwards may be isotropically etched. According to another embodiment of the present invention, the hard mask layer 14 may also be isotropically etched. Portions of the active region 13 and the gap-fill spacer 28 may be exposed by the recess regions 32.

The recess regions 32 may extend into the substrate 11. While the recess regions 32 are formed, the isolation layer 12, the gate capping layer 18, and the second impurity region 20 may be recessed to a predetermined depth. The bottom surface of the recess regions 32 may be positioned at a lower level than the upper surface of the bit line contact plug 22. The bottom surfaces of the recess regions 32 may be positioned at a higher level than the bottom surfaces of the bit line contact plug 22. The contact openings CO and the recess regions 32 may be coupled to each other. The vertical structure of the contact openings CO and the recess regions 32 may be referred to as a 'storage node contact hole'.

A dielectric structure (or spacer structure) may be formed on a sidewall of the bit line structure by performing an etching process for forming the recess regions 32. The dielectric structure may include materials having different dielectric constants.

The dielectric structure may include a seed liner 26, a conformal spacer 27, a protective spacer 29, and a low-k spacer 30. The seed liner 26 may directly contact the sidewalls of the bit line contact plug 22 and the bit line 23. The conformal spacer 27 may cover the seed liner 26. The protective spacer 29 may cover the conformal spacer 27, and the low-k spacer 30 may cover the is protective spacer 29. The seed liner 26 may be positioned between the conformal spacer 27 and the bit line contact plug 22, and the seed liner 26 may extend to be positioned between the conformal spacer 27 and the bit line 23. The conformal spacer 27 may be positioned between the protective spacer 29 and the seed liner 26, and the conformal spacer 27 may extend to be positioned between the gap-fill spacer 28 and the seed liner 26. The protective spacer 29 may be positioned between the low-k spacer 30 and the conformal spacer 27, and the bottom surface of the protective spacer 29 may contact the upper surface of the gap-fill spacer 28. The bottom surface of the low-k spacer 30 may contact the upper surface of the gap-fill spacer 28.

The seed liner 26, the conformal spacer 27, the protective spacer 29, and the low-k spacer 30 may be sequentially stacked on the sidewall of the bit line 23. The seed liner 26, the conformal spacer 27, and the gap-fill spacer 28 may be stacked on a sidewall of the bit line contact plug 22. The sidewalls and the bottom surface of the gap-fill spacer 28 may be covered by a stack of the seed liner 26 and the conformal spacer 27.

Figure 19:
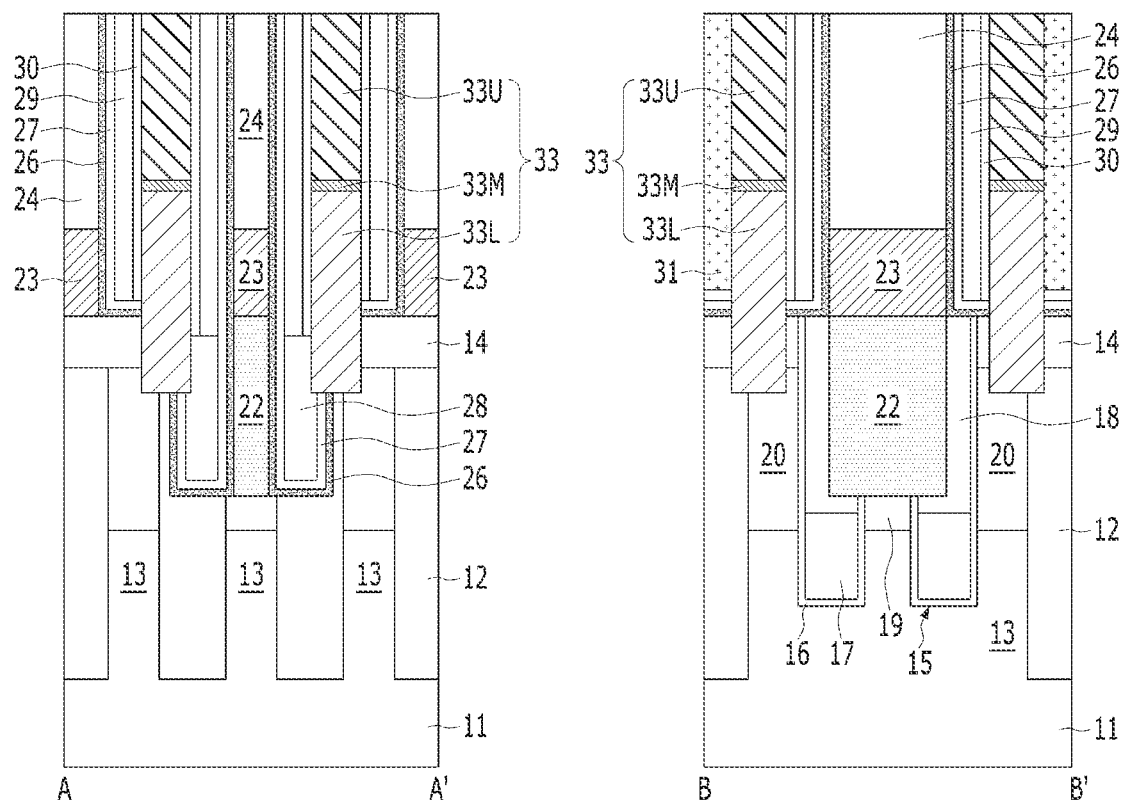

Referring to FIG. 19, a storage node contact plug 33 may be formed. The storage node contact plug 33 may fill the contact openings CO and the recess regions 32. The storage node contact plug 33 may contact the second impurity region 20. The storage node contact plug 33 may be adjacent to the bit line structure. From the perspective of a top view, a plurality of storage node contact plugs 33 may be positioned between a plurality of bit line structures. In a direction parallel to the bit line 23, a plurality of storage node contact plugs 33 and a plurality of plug isolation layers 31 may be alternately positioned between the neighboring bit lines 23.

In the storage node contact plug 33, a lower plug 33L, an ohmic contact layer 33M, and an upper plug 33U may be sequentially stacked.

The lower plug 33L may include a silicon-containing material. The lower plug 33L may include polysilicon. Polysilicon may be doped with an impurity. The lower plug 33L may be coupled to the second impurity region 20. The upper surface of the lower plug 33L may be higher than the upper surface of the bit line 23. The lower plug 33L may be formed by depositing polysilicon to fill the contact opening CO and the recess region 32 and then sequentially performing a planarization process and an etch-back process.

An ohmic contact layer 33M may be formed over the lower plug 33L. The ohmic contact layer 33M may include a metal silicide. The ohmic contact layer 33M may be formed by depositing a silicidable metal layer followed by performing an annealing process. Accordingly, silicidation may occur at the interface where the silicidable metal layer and the lower plug 33L contact each other, thereby forming a metal silicide layer. The ohmic contact layer 33M may, for example, include cobalt silicide. According to an embodiment of the present invention, the ohmic contact layer 33M may include cobalt silicide of a '$CoSi_2$ phase'.

When cobalt silicide of the $CoSi_2$ phase is formed as the ohmic contact layer 33M, cobalt silicide of low resistance may be formed as well as improving the contact resistance at the same time.

The upper plug 33U may be formed over the ohmic contact layer 33M. The upper plug 33U may be formed by gap-filling and planarizing a metal material. The upper plug 33U may be formed while filling the contact opening CO over the ohmic contact layer 33M. The upper plug 33U may include a metal-containing layer. The upper plug 33U may include a material containing tungsten. The upper plug 33U may include a tungsten layer or a tungsten compound.

According to another embodiment of the present invention, the upper portion of the upper plug 33U may extend to overlap with the upper surface of the bit line hard mask 24. For example, in order to form the upper plug 33U, a metal material may be deposited over the ohmic contact layer 33M and then the metal material may be removed.

Since the lower plug 33L contains polysilicon, and the ohmic contact layer 33M and the upper plug 33U contain a metal material, the storage node contact plug 33 may be referred to as a hybrid plug or a semi-metal plug.

As described above, the seed liner 26, the conformal spacer 27, and the gap-fill spacer 28 may be positioned between the bit line contact plug 22 and the lower plug 33L. The seed liner 26, the conformal spacer 27, the protective spacer 29, and the low-k spacer 30 may be positioned between the bit line 23 and the lower plug 33L.

The seed liner 26 and the gap-fill spacer 28 may include silicon nitride, and the conformal spacer 27 and the low-k spacer 30 may include a low-k material. The protective spacer 29 may include silicon oxide. Accordingly, a dielectric structure of an WOK structure may be provided between the bit line 23 and the lower plug 33L, and a dielectric structure of an NKN structure may be provided between the bit line contact plug 22 and the lower plug 33L. According to another embodiment of the present invention, referring to FIG. 6C, the protective spacer 29 may be replaced with an air gap. In this case, an NKAK (Nitride-Low k-Air gap-Low k) structure may be provided between the bit line 23 and the storage node contact plug 33. In order to form the air gap AG, the protective spacer 29 may be selectively removed, and an air gap capping layer AGC may be formed over the air gap AG.

The parasitic capacitance between the bit line 23 and the lower plug 33L may be reduced by the conformal spacer 27 and the low-k spacer 30. The step coverage of the conformal spacer 27 may be improved by the seed liner 26. The loss of the conformal spacer 27 may be prevented by the protective spacer 29.

As described above, since the parasitic capacitance is reduced, the sensing margin of a memory cell may be improved.

Subsequently, a memory element (see '230' in FIG. 6A) may be formed over the upper plug 33U. According to another embodiment of the present invention, a landing pad may be further formed between the upper plug 33U and the memory element.

According to another embodiment of the present invention, as illustrated in FIG. 6C, after forming the upper plug 33U, the protective spacer 29 may be removed to form the air gap AG. Subsequently, the air gap capping layer AGC may be formed over the air gap AG.

Figure 20:
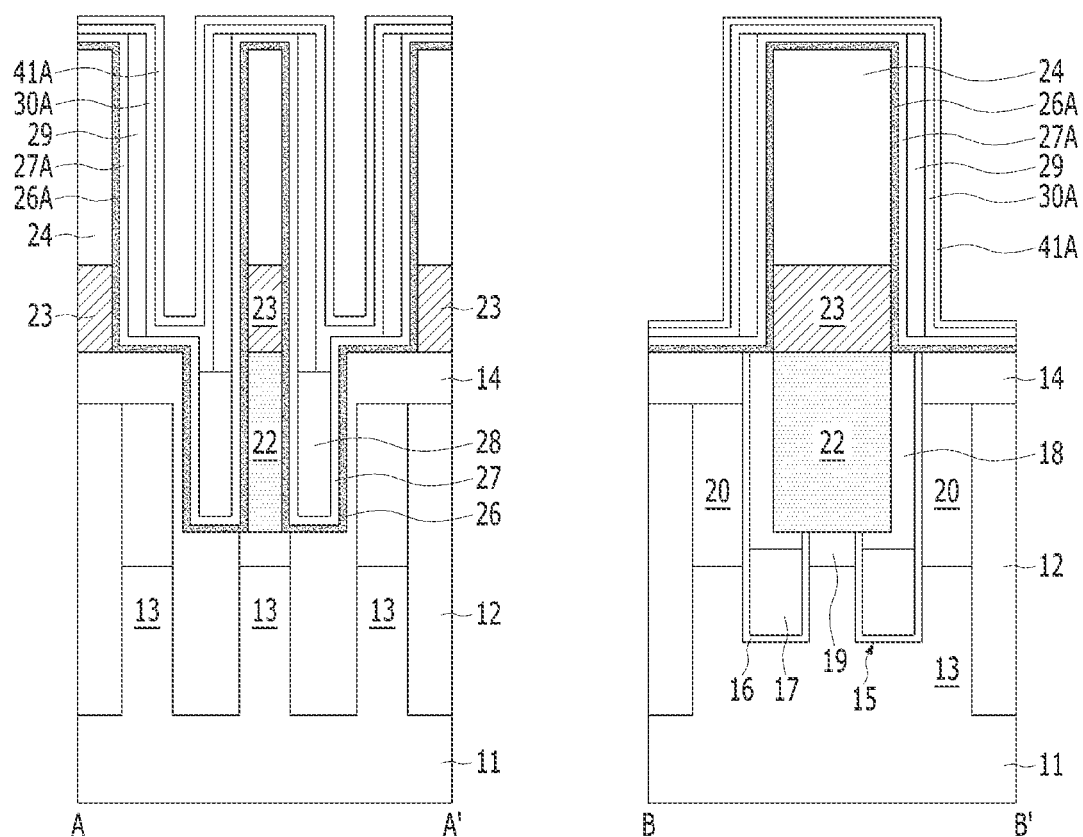
FIGS. 20 to 22 are cross-sectional views illustrating a method for fabricating a semiconductor device in accordance with another embodiment of the present invention.
Figure 21:
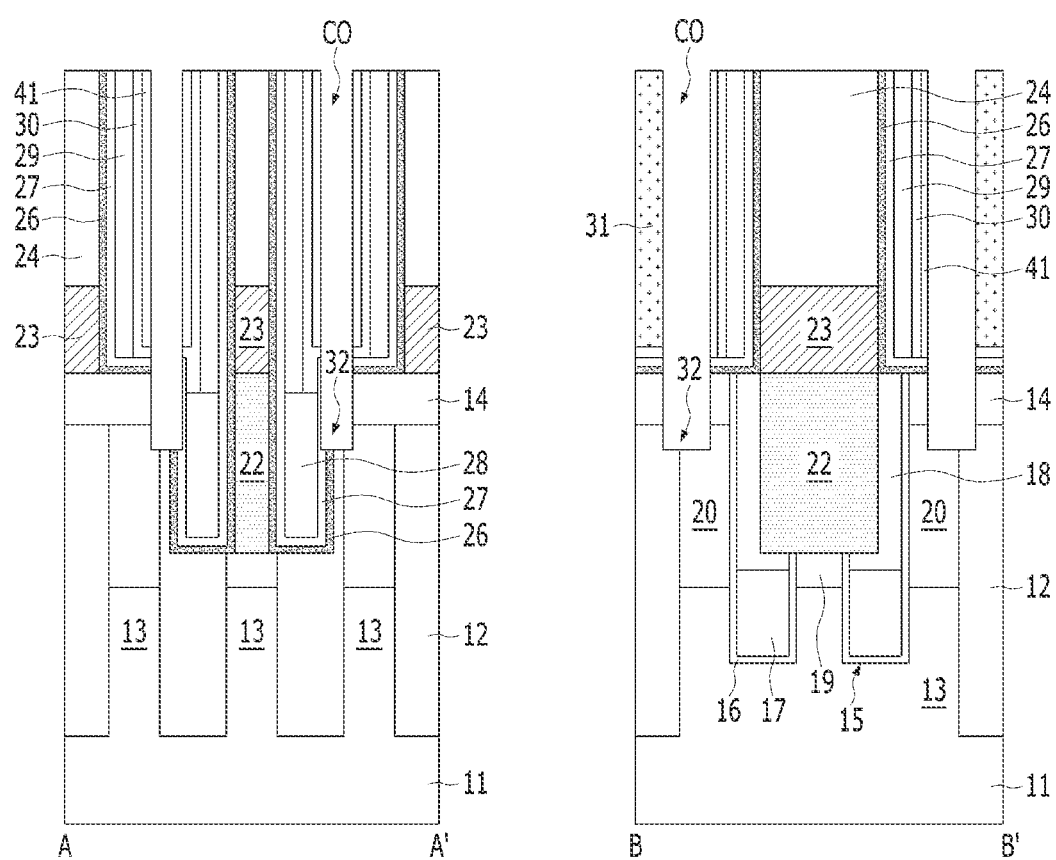
Figure 22:
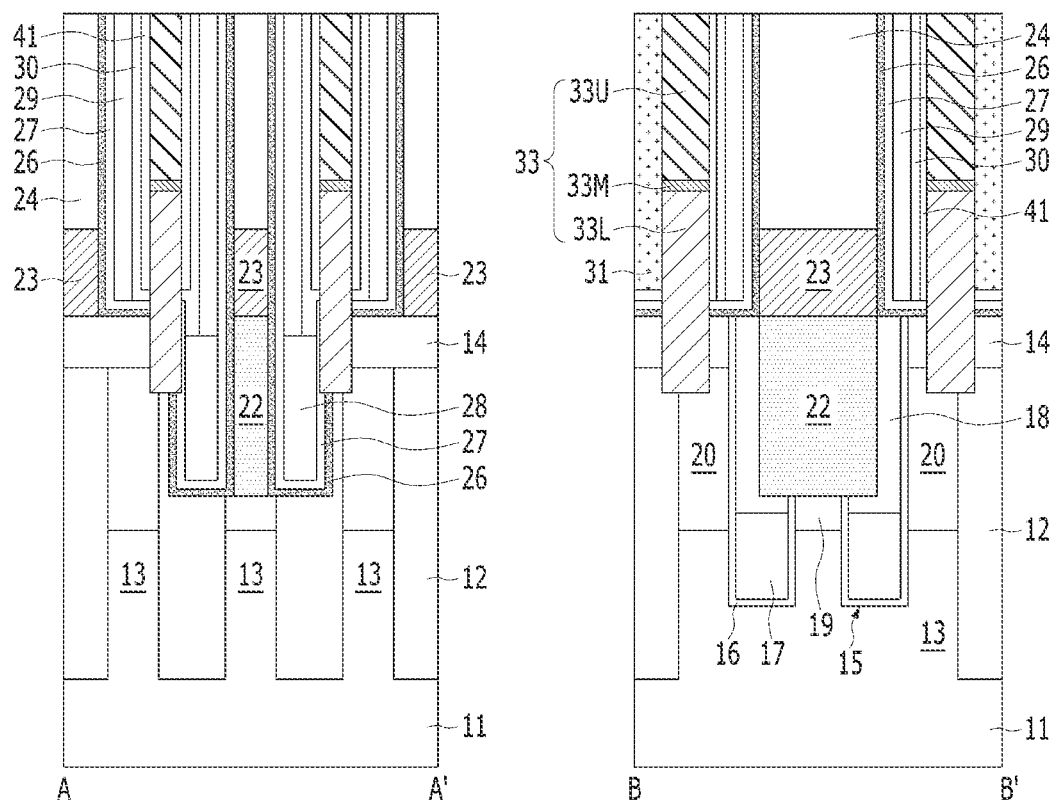

FIGS. 20 to 22 are cross-sectional views illustrating a method for fabricating a semiconductor device in accordance with another embodiment of the present invention. In FIGS. 20 to 22, the same reference numerals also appearing in FIGS. 7 to 19 may denote the same constituent elements, and detailed description on them may be omitted herein.

Referring to FIG. 20, after forming the bit line contact plug 22 and the bit line 23 over the substrate 11 by performing the processes described above with reference to FIGS. 7 to 17, a seed layer 26A, a conformal layer 27A, a gap-fill spacer 28, a protective spacer 29, and a low-k spacer layer 30A may be formed.

Subsequently, a protective liner layer 41A may be formed over the low-k spacer layer 30A. The protective liner layer 41A may be formed of the same material as that of the seed layer 26A. The protective liner layer 41A may be thinner than the conformal layer 27A and the low-k spacer layer 30A. The low-k spacer layer 30A may have a lower dielectric constant than the protective liner layer 41A. The protective liner layer 41A may have an etch selectivity with respect to the low-k spacer layer 30A. The protective liner layer 41A may include silicon nitride. The protective liner layer 41A may have a thickness of approximately 20 Å or less, for example from approximately 1 to approximately 20 Å, and may include ultra-thin silicon nitride.

Referring to FIG. 21, contact openings CO and plug isolation layers 31 may be alternately formed in a manner similar to that described with reference to FIG. 18. Subsequently, recess regions 32 may be formed.

A dielectric structure (or spacer structure) may be formed on a sidewall of the bit line structure by performing an etching process for forming the recess regions 32. The dielectric structure may include materials having different dielectric constants.

The dielectric structure may include a seed liner 26, a conformal spacer 27, a protective spacer 29, a low-k spacer 30, and a protective liner 41. The seed liner 26 may directly contact the sidewalls of the bit line contact plug 22 and the bit line 23. The conformal spacer 27 may cover the seed liner 26. The protective spacer 29 may cover the conformal spacer 27, and the low-k spacer 30 may cover the protective spacer 29. The protective liner 41 may cover the low-k spacer 30. The seed liner 26 may be positioned between the conformal spacer 27 and the bit line contact plug 22, and the seed liner 26 may extend to be positioned between the conformal spacer 27 and the bit line 23. The conformal spacer 27 may be positioned between the protective spacer 29 and the seed liner 26, and the conformal spacer 27 may extend to be positioned between the gap-fill spacer 28 and the seed liner 26. The protective spacer 29 may be positioned between the low-k spacer 30 and the conformal spacer 27, and the bottom surface of the protective spacer 29 may contact the upper surface of the gap-fill spacer 28. The bottom surface of the low-k spacer 30 may contact the upper surface of the gap-fill spacer 28.

The seed liner 26, the conformal spacer 27, the protective spacer 29, the low-k spacer 30, and the protective liner 41 may be sequentially stacked on the sidewall of the bit line 23. The seed liner 26, the conformal spacer 27, and the gap-fill spacer 28 may be stacked on the sidewall of the bit line contact plug 22. The sidewalls and the bottom surface of the gap-fill spacer 28 may be covered by a stack of the seed liner 26 and the conformal spacer 27.

Referring to FIG. 22, the storage node contact plug 33 may be formed in a similar manner to that described with reference to FIG. 19.

As described above, the seed liner 26, the conformal spacer 27, and the gap-fill spacer 28 may be positioned between the bit line contact plug 22 and the lower plug 33L. The seed liner 26, the conformal spacer 27, the protective spacer 29, the low-k spacer 30, and the protective liner 41 may be positioned between the bit line 23 and the lower plug 33L.

The seed liner 26, the gap-fill spacer 28 and the protective liner 41 may contain silicon nitride, and the conformal spacer 27 and the low-k spacer 30 may contain a low-k material. The protective spacer 29 may include silicon oxide. Accordingly, a dielectric structure of an NKOKN structure may be provided between the bit line 23 and the lower plug 33L, and a dielectric structure of an NKN structure may be provided between the bit line contact plug 22 and the lower plug 33L.

According to another embodiment of the present invention, the protective spacer 29 may be removed to form an air gap. In this case, an NKOKN (Nitride-Low k-Air gap-Low k-Nitride) structure may be provided between the bit line 23 and the storage node contact plug 33, and an NKN structure may be provided between the bit line contact plug 22 and the storage node contact plug 33.

According to another embodiment of the present invention, the low-k spacer 30 may be omitted. In this case, a NKON (Nitride-Low k-Oxide-Nitride) structure may be provided between the bit line 23 and the storage node contact plug 33, and an NKN structure may be provided between the bit line contact plug 23 and the storage node contact plug 33. Also, when the low-k spacer 30 is omitted and the protective spacer 29 is replaced with an air gap, a NKAN (Nitride-Low k-Air gap-Nitride) may be provided between the bit line 23 and the storage node contact plug 33, and an NKN structure may be provided between the bit line contact plug 23 and the storage node contact plug 33.

Figure 23:
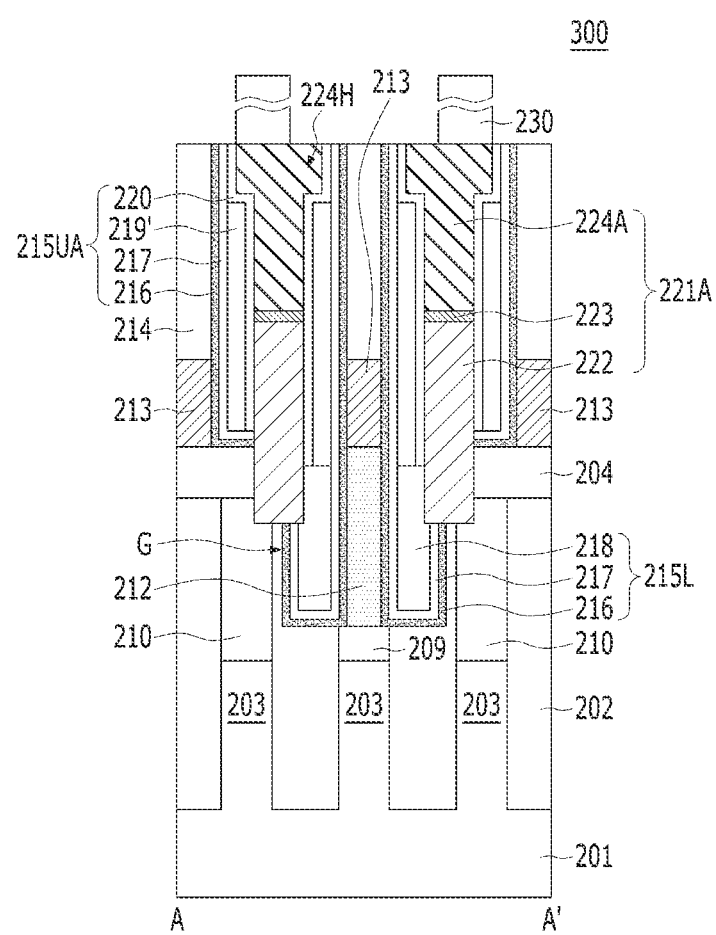
FIG. 23 is a cross-sectional view illustrating a semiconductor device in accordance with another embodiment of the present invention.

FIG. 23 is a cross-sectional view illustrating a semiconductor device 300 in accordance with another embodiment of the present invention. In FIG. 23, the same reference numerals also appearing in FIGS. 5 to 6B may denote the same constituent elements, and detailed descriptions on them may be omitted.

Referring to FIG. 23, the semiconductor device 300 may include a plurality of memory cells. Each memory cell may include a cell transistor including a buried word line 207, a bit line 213, and a memory element 230. Other constituent elements except for the second spacer structure 215UA may be the same as those of FIGS. 5 to 6B. A first spacer structure 215L may be formed between the bit line contact plug 212 and the storage node contact plug 221A. A second spacer structure 215UA may be formed between the bit line 213 and the storage node contact plug 221A. The first spacer structure 215L may include a seed liner 216, a conformal spacer 217, and a gap-fill spacer 218. The second spacer structure 215UA may include a seed liner 216, a conformal spacer 217, a protective spacer 219', and a low-k spacer 220. The conformal spacer 217 and the low-k spacer 220 may have a lower dielectric constant than the seed liner 216. The conformal spacer 217 and the low-k spacer 220 may include SiC, SiCO, SiCN, SiOCN, SiBN, or SiBCN. The conformal spacer 217 and the low-k spacer 220 may have a lower dielectric constant than silicon nitride, but they may include different low-k materials. The protective spacer 219' may include silicon oxide. The protective spacer 219' may have a dielectric constant which is lower or higher than those of the conformal spacer 217 and the low-k spacer 220, and the seed liner 216 may have a higher dielectric constant than the protective spacer 219'.

The seed liner 216 may have a thickness of approximately 20 Å or less. In an embodiment, the seed liner 111 may have a thickness of approximately 1 to approximately 20 Å. The seed liner 216 may serve as a seed for uniform deposition of the conformal spacer 217. The conformal spacer 217 and the seed liner 216 may directly contact each other. According to another embodiment of the present invention, the total thickness of the conformal spacer 217 and the protective spacer 219' may be greater than the thickness of the seed liner 216.

The second spacer structure 215UA may have an NKOK structure and may be provided between the bit line 213 and the storage node contact plug 221A. The first spacer structure 215L of an NKN structure may be provided between the bit line contact plug 212 and the storage node contact plug 221A.

The storage node contact plug 221A of the semiconductor device 300 may be formed between neighboring bit line structures. The storage node contact plug 221A may be coupled to the second impurity region 210. The storage node contact plug 221A may include a lower plug 222 and an upper plug 224A. The storage node contact plug 221A may further include an ohmic contact layer 223 between the lower plug 222 and the upper plug 224A. The ohmic contact layer 223 may include a metal silicide. For example, the lower plug 222 may include polysilicon, and the upper plug 224A may include a metal nitride, a metal material, or a combination thereof.

The upper plug 224A may include a head portion 224H. The head portion 224H of the upper plug 224A may be positioned at a higher level than the upper surface of the protective spacer 219'. In an embodiment, the head portion 224H of the upper plug 224A may be partially overlapping with the upper surface of the protective spacer 219'.

The head portion 224H may be a landing pad, and a memory element 230 may be formed over the head portion 224H of the upper plug 224A. The memory element 230 may include a capacitor including a storage node. The landing surface area between the upper plug 224A and the memory element 230 may increase due to the head portion 224H.

According to another embodiment of the present invention, the protective spacer 219' may be replaced with an air gap. In this case, the second spacer structure 215UA having a NKAK (nitride-low k-air gap-low k) structure may be provided between the bit line 213 and the storage node contact plug 221A, and the first spacer structure 215L having an NKN structure may be provided between the bit line contact plug 212 and the storage node contact plug 221A.

Hereinafter, an example of a method for fabricating the semiconductor device 300 shown in FIG. 23 will be described with reference to FIGS. 24 to 27.

FIGS. 24 to 27 are cross-sectional views illustrating a method of fabricating a semiconductor device in accordance with another embodiment of the present invention. In FIGS. 24 to 27, the same reference numerals &so appearing in FIGS. 7 to 19 may denote the same constituent elements, and detailed descriptions thereon may be omitted below.

After the bit line contact plug 22 and the bit line 23 are formed over the substrate 11 by performing the processes described with reference to FIGS. 7 to 15, the seed layer 26A, the conformal layer 27A, and the gap-fill spacer 28 may be formed. Subsequently, a protective material 29A may be deposited over the gap-fill spacer 28.

Figure 24:
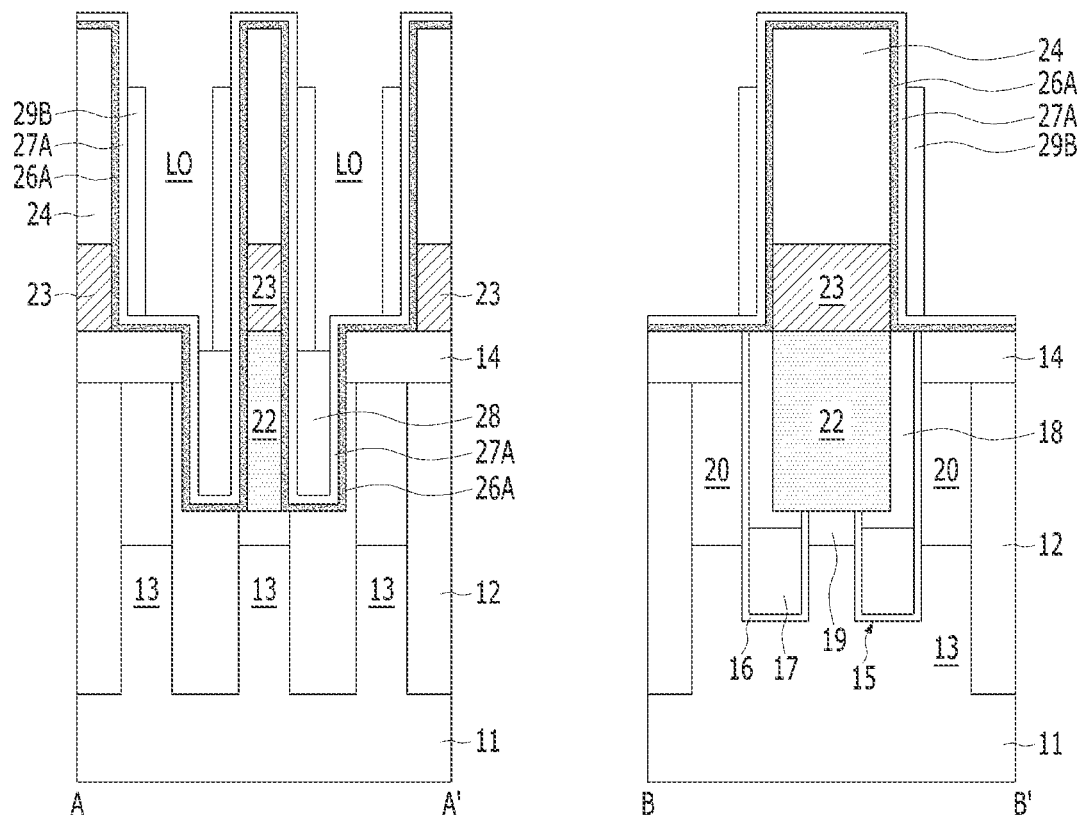
FIGS. 24 to 27 are cross-sectional views illustrating a method of fabricating a semiconductor device in accordance with another embodiment of the present invention.

Referring to FIG. 24, a protective spacer 29B may be formed by etching the protective material 29A. The bottom surface of the is protective spacer 29B may be positioned at a lower level than the bottom surface of the bit line 23. The upper surface of the protective spacer 29B may be positioned at a lower level than the upper surface of the bit line hard mask 24.

The protective spacer 29B may prevent the conformal layer 27A from being damaged on both sidewalls of the bit line 23 from the subsequent process.

Figure 25:
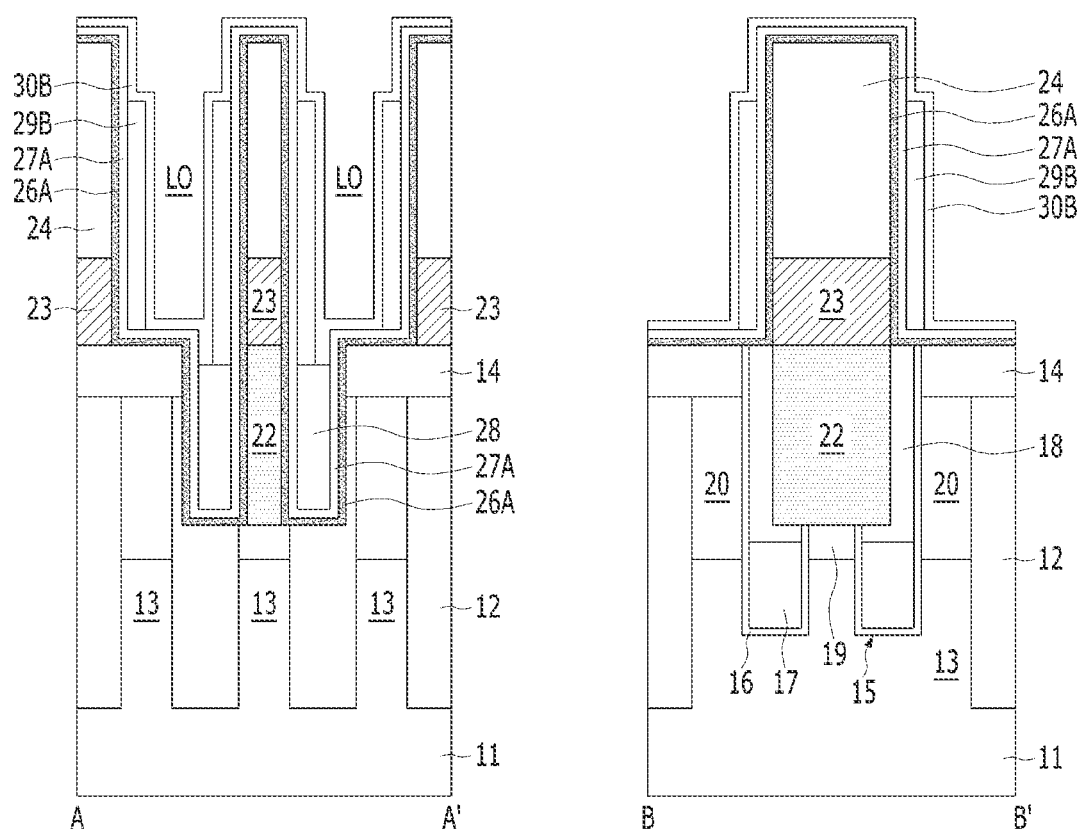

Referring to FIG. 25, a low-k spacer layer 30B may be formed over the exposed surfaces of the structure of FIG. 24 including the protective spacer 29B. The low-k spacer layer 30B may have a lower dielectric constant than the seed layer 26A. The low-k spacer layer 30B may have the same dielectric constant as that of the conformal layer 27A. The low-k spacer layer 30B and the conformal layer 27A may be of the same material. The low-k spacer layer 30B may include a low-k material, and the low-k spacer layer 30B may have a lower dielectric constant than silicon nitride. The low-k spacer layer 30B may have a dielectric constant of approximately 4.4 or less. The low-k spacer layer 30B may include a silicon-based material. The low-k spacer layer 30B may include at least one chemical species selected among carbon and boron. The low-k spacer layer 30B may include a carbon-doped silicon-based material or a boron-doped silicon-based material. The low-k spacer layer 30B may include SiC, SiCO, SiCN, SiOCN, SiBN, or SiBCN.

The low-k spacer layer 30B may be formed, for example, by Atomic Layer Deposition (ALD). Since the protective spacer 293 and the low-k spacer layer 30B are sequentially formed over the conformal layer 27A having improved step coverage, the step coverage of the low-k spacer layer 30B may also be improved. According to another embodiment of the present invention, the low-k spacer layer 30B may have a worse step coverage than the conformal layer 27A.

As described above, since the low-k spacer layer 30B is formed over the protective spacer 29B whose height is lowered, it may be possible to prevent the protective spacer 29B from being exposed to the subsequent process.

Figure 26:
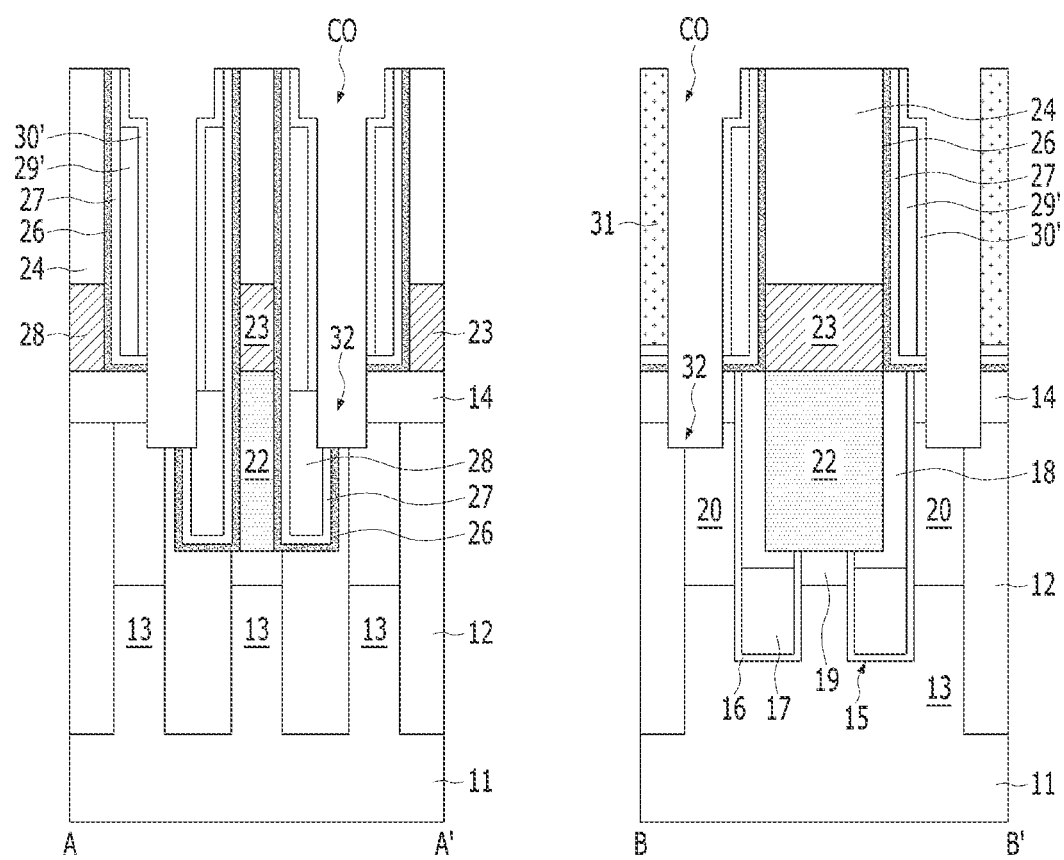

Referring to FIG. 26, a plurality of plug isolation layers 31 may be formed over the low-k spacer layer 30B. The plug isolation layers 31 may separate each of line-type openings LO between the bit line structures into a plurality of contact openings CO. As illustrated in FIG. 5, the plug isolation layers 31 may vertically overlap with the buried word line 17 over the buried word line 17 in the direction A-A'. The plug isolation layers 31 may include silicon nitride. According to another embodiment of the present invention, while the plug isolation layers 31 are formed, a portion of the bit line hard mask 24 may be consumed.

From the perspective of a top view, contact openings CO and plug isolation layers 31 may be alternately formed between the neighboring bit lines 23 in the direction that the bit line 23 extends. The neighboring contact openings CO may be arranged in a shape isolated by the bit line structure and the plug isolation layers 31. From the perspective of the top view, the contact opening CO may have a rectangular hole shape.

The lower materials may be etched to be self-aligned to the contact openings CO. Accordingly, a plurality of recess regions 32 exposing a portion of the active region 13 may be formed between the bit line structures. An anisotropic etching process or a combination of an anisotropic etching process and an isotropic etching process may be used to form the recess regions 32. For example, among the structures exposed through the contact openings CO between the bit line structures, the low-k spacer layer 30B, the conformal layer 27A, and the seed layer 26A may be sequentially anisotropically etched. Then, a portion of the active region 13 exposed afterwards may be isotropically etched. According to another embodiment of the present invention, the hard mask layer 14 may also be isotropically etched, Portions of the active region 13 and the gap-fill spacer 28 may be exposed by the recess regions 32.

The recess regions 32 may extend into the substrate 11. While the recess regions 32 are formed, an isolation layer 12, a gate capping layer 18, and a second impurity region 20 may be recessed to a predetermined depth. The bottom surface of the recess regions 32 may be positioned at a lower level than the upper surface of the bit line contact plug 22. The bottom surfaces of the recess regions 32 may be positioned at a higher level than the bottom surface of the bit line contact plug 22. The contact openings CO and the recess regions 32 may be coupled to each other. The vertical structure of the contact openings CO and the recess regions 32 may be referred to as a 'storage node contact hole'.

A dielectric structure (or a spacer structure) may be formed on the sidewall of the bit line structure by performing an etching process to form the recess regions 32. The dielectric structure may include materials having different dielectric constants.

The dielectric structure may include a seed liner 26, a conformal spacer 27, a protective spacer 29', and a low-k spacer 30'. The seed liner 26 may directly contact the bit line contact plug 22 and the sidewall of the bit line 23. The conformal spacer 27 may cover the seed liner 26. The protective spacer 29' may cover the conformal spacer 27, and the low-k spacer 30' may cover the protective spacer 29'. The seed liner 26 may be positioned between the conformal spacer 27 and the bit line contact plug 22, and the seed liner 26 may extend to be positioned between the conformal spacer 27 and the bit line 23. The conformal spacer 27 may be positioned between the protective spacer 29' and the seed liner 26, and the conformal spacer 27 may extend to be positioned between the gap-fill spacer 28 and the seed liner 26. The protective spacer 29' may be positioned between the low-k spacer 30' and the conformal spacer 27, and the bottom surface of the protective spacer 29' may contact the upper surface of the gap-fill spacer 28. The bottom surface of the low-k spacer 30' may contact the upper surface of the gap-fill spacer 28. The upper surface of the protective spacer 29' may be covered by the low-k spacer 30'.

The seed liner 26, the conformal spacer 27, the protective spacer 29', and the low-k spacer 30' may be sequentially stacked on the sidewall of the hit line 23. The seed liner 26, the conformal spacer 27, and the gap-fill spacer 28 may be stacked on the sidewall of the bit line contact plug 22. The sidewalls and bottom surfaces of the gap-fill spacer 28 may be covered by a stack of the seed liners 26 and the conformal spacers 27.

Figure 27:
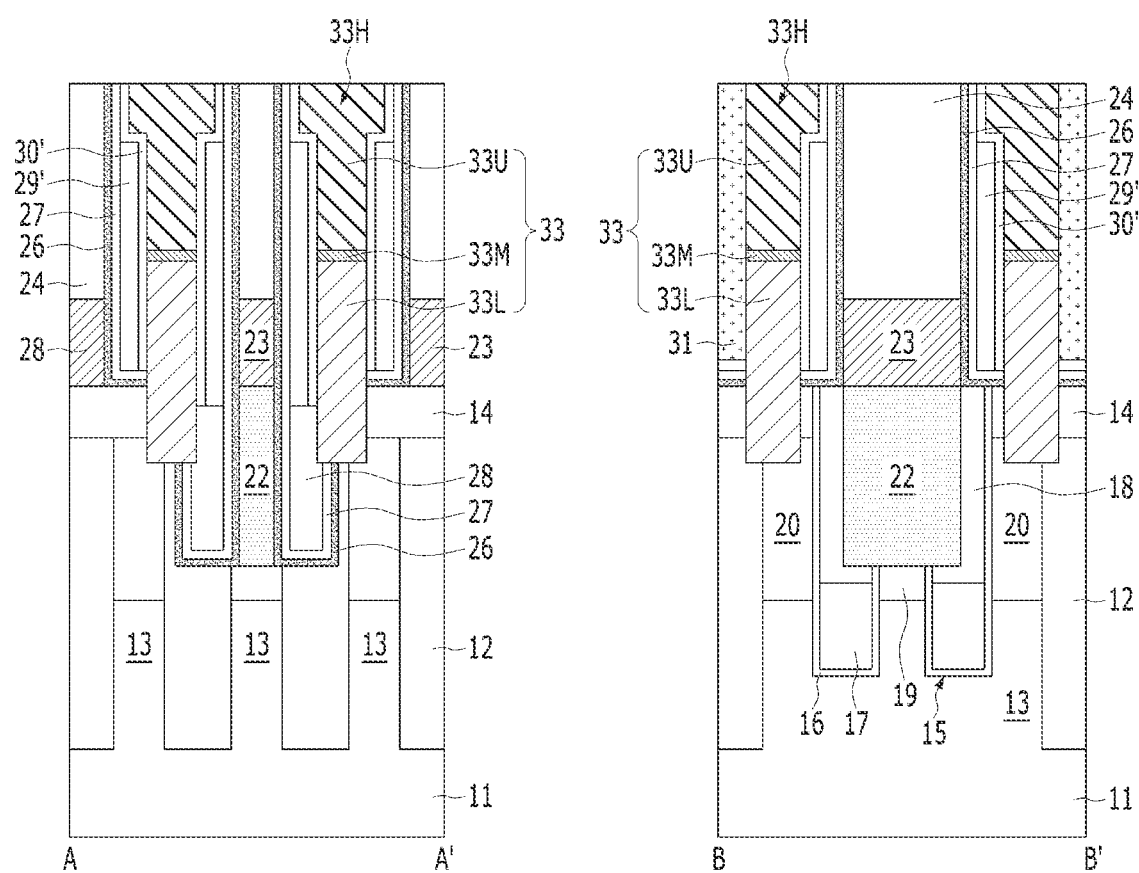

Referring to FIG. 27, the storage node contact plug 33 may be formed. The storage node contact plug 33 may fill the contact openings CO and the recess regions 32. The storage node contact plug 33 may contact the second impurity region 20. The storage node contact plug 33 may be adjacent to the bit line structure. From the perspective of a top view, a plurality of storage node contact plugs 33 may be positioned between a plurality of bit line structures. In a direction parallel to the bit line 23, a plurality of storage node contact plugs 33 and a plurality of plug isolation layers 31 may be alternately positioned between the neighboring bit lines 23.

In the storage node contact plug 33, a lower plug 33L, an ohmic contact layer 33M, and an upper plug 33U may be sequentially stacked. The upper plug 33U may include a head portion 33H overlapping partially with the upper surface of the protective spacer 29'.

As described above, the seed liner 26, the conformal spacer 27, and the gap-fill spacer 28 may be positioned between the bit line contact plug 22 and the lower plug 33L. The seed liner 26, the conformal spacer 27, the protective spacer 29', and the low-k spacer 30' may be positioned between the bit line 23 and the lower plug 33L.

The seed liner 26 and the gap-fill spacer 28 may include silicon nitride, and the conformal spacer 27 and the low-k spacer 30' may include a low-k material. The protective spacer 29' may include silicon oxide. Accordingly, a dielectric structure of an NKOK structure may be provided between the bit line 23 and the lower plug 33L, and a dielectric structure of an NKN structure may be provided between the bit line contact plug 22 and the lower plug 33L. According to another embodiment of the present invention, the protective spacer 29' may be replaced with an air gap. In this case, a NKAK (Nitride-Low k-Air gap-Low k) structure may be provided between the bit line 23 and the storage node contact plug 33.

The parasitic capacitance between the bit line 23 and the lower plug 33L may be reduced by the conformal spacer 27 and the low-k spacer 30'. The step coverage of the conformal spacer 27 may be is improved by the seed liner 26. Loss of the conformal spacer 27 may be prevented by the protective spacer 29'.

Since the low-k spacer 30' fully covers the protective spacer 29', a short or bridge between the storage node contact plug 33 and the bit line 23 may be prevented.

FIGS. 28 to 32 are cross-sectional views illustrating a method of fabricating a semiconductor device in accordance with another embodiment of the present invention. In FIGS. 28 to 32, the same reference numerals also appearing in FIGS. 7 to 27 may denote the same constituent elements, and detailed descriptions thereon may be omitted below.

After the bit line contact plug 22 and the bit line 23 over the substrate 11 are formed by performing the processes described above with reference to FIGS. 7 to 15, the seed layer 26A, the conformal layer 27A, and the gap-fill spacer 28 may be formed. Subsequently, a protective material 29A may be deposited over the gap-fill spacer 28.

Figure 28:
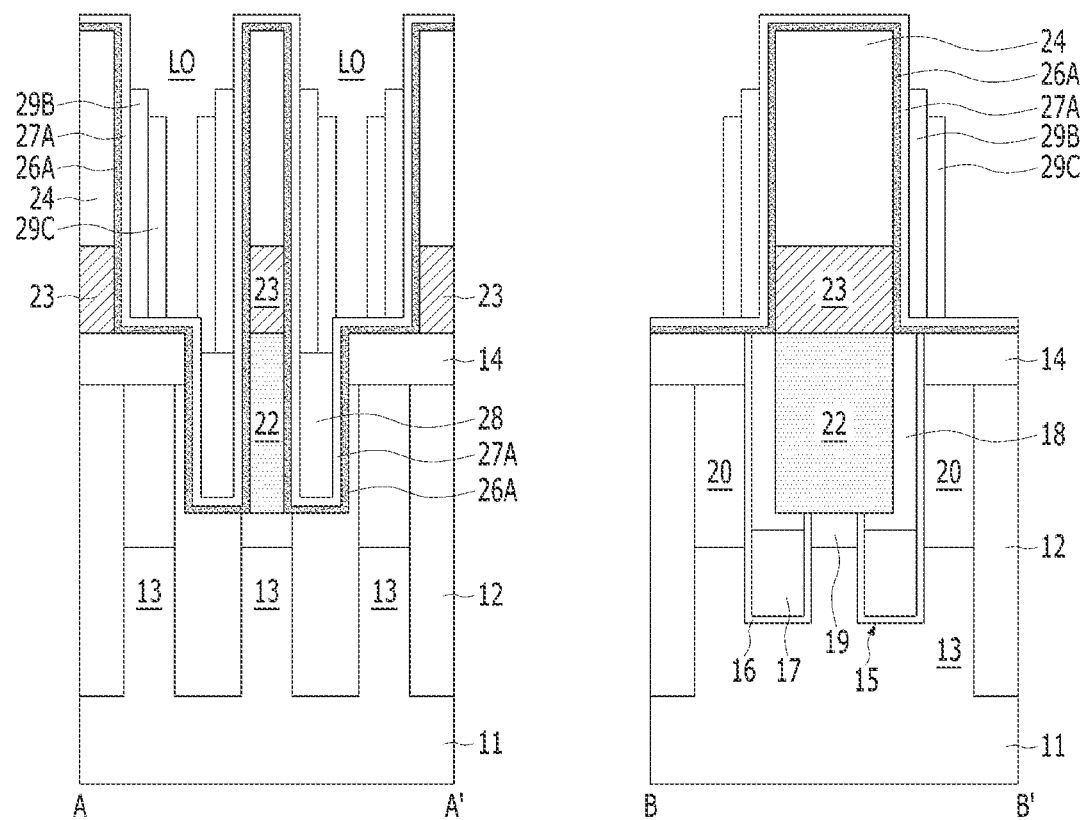
FIGS. 28 to 32 are cross-sectional views illustrating a method of fabricating a semiconductor device in accordance with another embodiment of the present invention.

Referring to FIG. 28, a protective spacer 29B may be formed by etching the protective material 29A. The bottom surface of the protective spacer 29B may be positioned at a lower level than the bottom surface of the bit line 23. The upper surface of the protective spacer 29B may be positioned at a lower level than the upper surface of the bit line hard mask 24.

The protective spacer 29B may prevent the conformal layer 27A from being damaged on both sidewalls of the bit line 23 during the subsequent process.

Subsequently, an additional sacrificial protective material 29C may be formed over the protective spacer 29B whose height as lowered. The additional sacrificial protective material 29C may have an etch selectivity with respect to the protective spacer 29B. The additional sacrificial protective material 29C may include titanium nitride.

Subsequently, by selectively etching the additional sacrificial protective material 29C, the upper portion of the protective spacer 29B may be exposed. The upper surface of the additional sacrificial protective material 29C may be positioned at a lower level than the upper surface of the protective spacer 29B.

According to another embodiment of the present invention, after the additional sacrificial protective material 29C is deposited over the protective material 29A of FIG. 15, the protective spacer 29B having a lowered height may be formed by sequentially etching the additional sacrificial protective material 29C and the protective material 29A. Subsequently, the additional sacrificial protective material 29C may be further etched to expose the upper portion of the protective spacer 29B.

Figure 29:
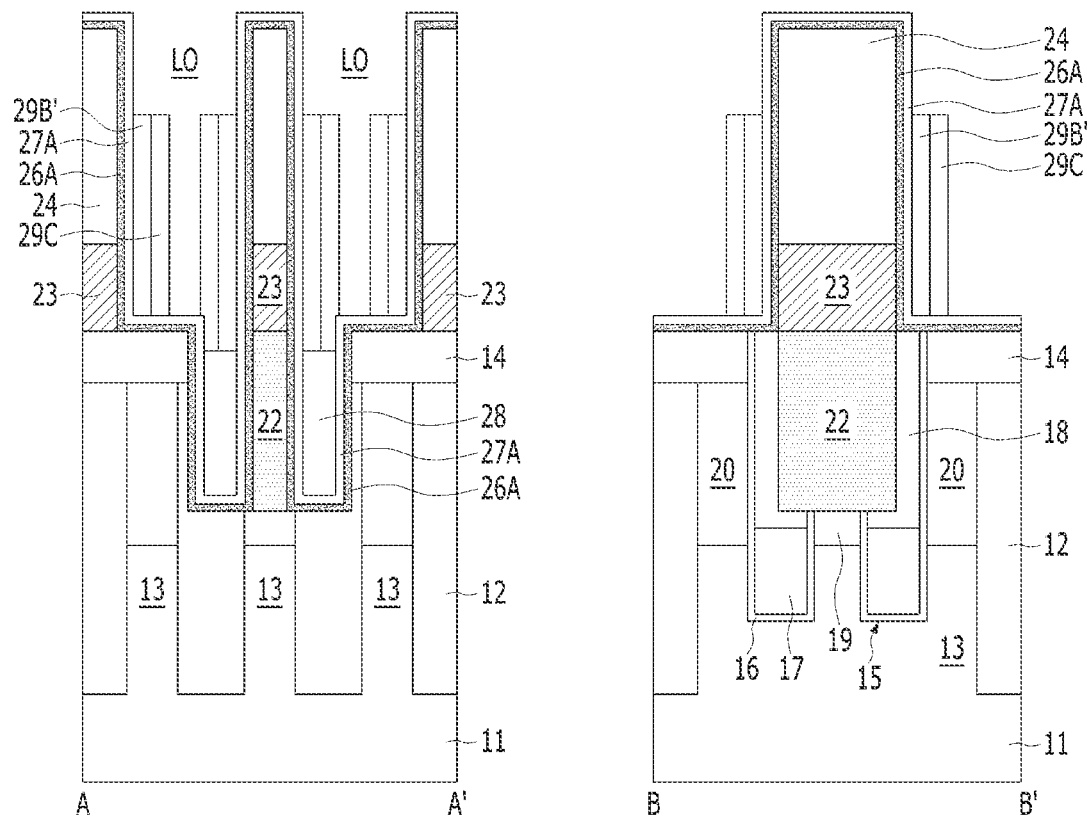

Referring to FIG. 29, by selectively removing the upper portion of the exposed protective spacer 29B, a protective spacer 29B' having a lower height may be formed.

The upper surface of the protective spacer 29B' may be positioned at a lower level than the upper surface of the protective spacer 29B.

As described above, the protective spacer 29B' having a lower height may be protected from the subsequent process.

Figure 30:
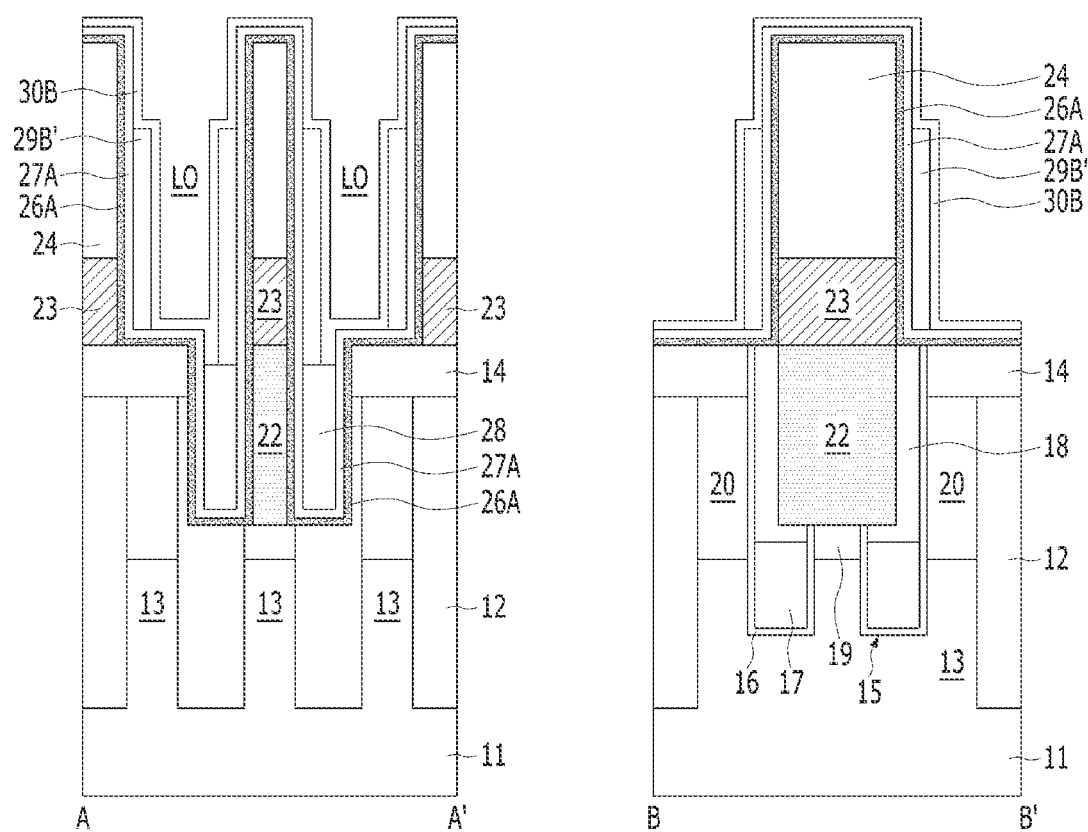

Referring to FIG. 30, the additional sacrificial protective material 29C may be removed, Subsequently, a low-k spacer layer 30B may be formed over the protective spacer 293'. The low-k spacer layer 30B may have a lower dielectric constant than the seed layer 26A. The low-k spacer layer 30B may have the same dielectric constant as that of the conformal layer 27A. The low-k spacer layer 30B and the conformal layer 27A may be of the same material. The low-k spacer layer 30B may include a low-k material, and the low-k spacer layer 30B may have a lower dielectric constant than silicon nitride. The low-k spacer layer 30B may have a dielectric constant of approximately 4.4 or less. The low-k spacer layer 30B may include a silicon-based material. The low-k spacer layer 30B may include at least one chemical species selected among carbon and boron. The low-k spacer layer 30B may include a carbon-doped silicon-based material or a boron-doped silicon-based material. The low-k spacer layer 30B may include SiC, SiCO, SiCN, SiOCN, SiBN, or SiBCN.

The low-k spacer layer 30B may be formed, for example, by an Atomic Layer Deposition (ALD) process. Since the protective spacer 29B' and the low-k spacer layer 30B are sequentially formed over the conformal layer 27A with improved step coverage, the step coverage of the low-k spacer layer 30B may also be improved. According to another embodiment of the present invention, the low-k spacer layer 30B may have a worse step coverage than the conformal layer 27A.

As described above, since the low-k spacer layer 30B is formed over the protective spacer 29B' having a lower height, it may be possible to further prevent the protective spacer 29B' from being exposed during the subsequent process.

Figure 31:
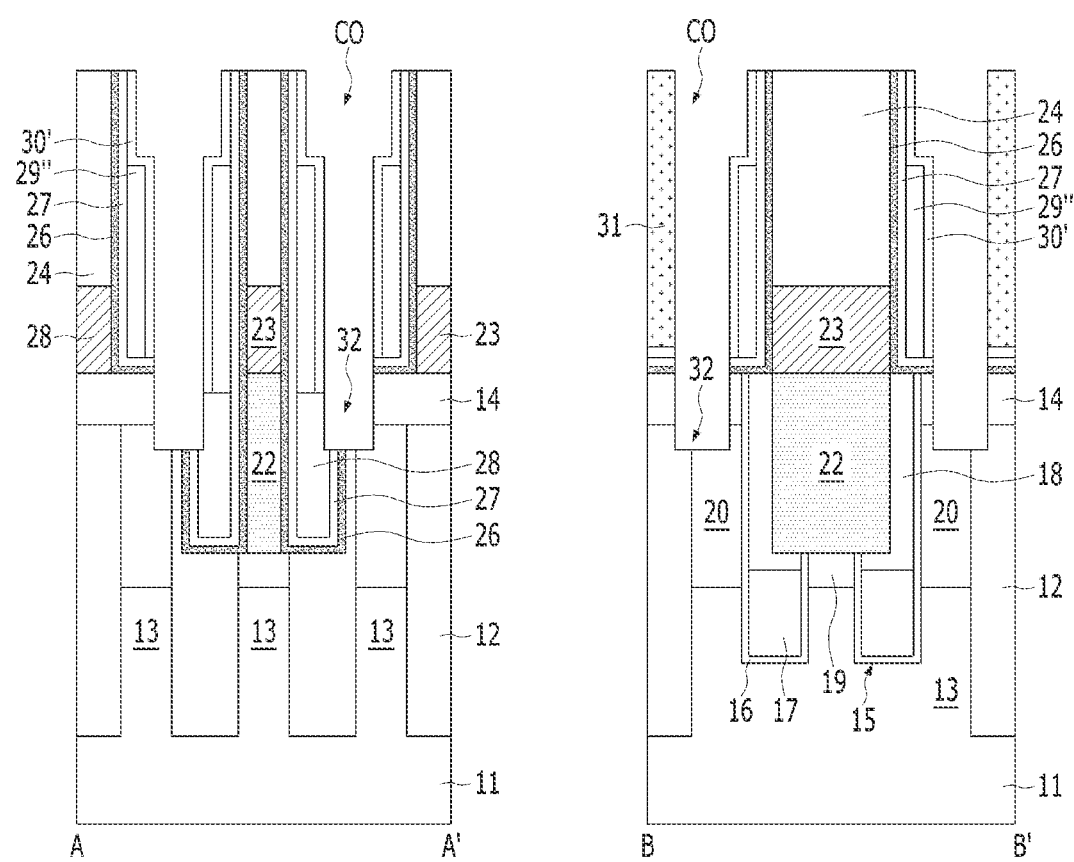

Referring to FIG. 31, a plurality of plug isolation layers 31 may be formed over the low-k spacer layer 30B. The plug isolation layers 31 may separate each of line-type openings LO between the bit line structures into a plurality of contact openings CO. As illustrated in FIG. 5, the plug isolation layers 31 may vertically overlap with the buried word line 17 above the buried word line 17 in the direction A-A'. The plug isolation layers 31 may include silicon nitride. According to another embodiment of the present invention, while the plug isolation layers 31 is formed, a portion of the bit line hard mask 24 may be consumed.

From the perspective of a top view, the contact openings CO and the plug isolation layers 31 may be alternately formed between neighboring bit lines 23 in a direction that the bit line 23 extends. The neighboring contact openings CO may be arranged in an isolated shape by the bit line structure and the plug isolation layers 31. From the perspective of a top view, the contact opening CO may have a rectangular hole shape.

The lower materials may be etched to be self-aligned to the contact openings CO. As a result, a plurality of recess regions 32 exposing a portion of the active region 13 between the bit line structures may be formed. An anisotropic etching process or a combination of an anisotropic etching process and an isotropic etching process may be used to form the recess regions 32. For example, among the structures exposed through the contact openings CO between the bit line structures, the low-k spacer layer 30B, the conformal layer 27A, and the seed layer 26A may be sequentially anisotropically etched, and then a portion of the active region 13 exposed afterwards may be isotropically etched. According to another embodiment of the present invention, the hard mask layer 14 may also be isotropically etched. Portions of the active region 13 and the gap-fill spacer 28 may be exposed by the recess regions 32.

The recess regions 32 may extend into the substrate 11. While the recess regions 32 are formed, the isolation layer 12, the gate capping layer 18, and the second impurity region 20 may be recessed to a predetermined depth. The bottom surfaces of the recess regions 32 may be positioned at a lower level than the upper surface of the bit line contact plug 22. The bottom surfaces of the recess regions 32 may be positioned at a higher level than the bottom surfaces of the bit line contact plug 22. The contact openings CO and the recess regions 32 may be coupled to each other. The vertical structure of the contact openings CO and the recess regions 32 may be referred to as a 'storage node contact hole'.

A dielectric structure (or spacer structure) may be formed on the sidewall of the bit line structure by performing an etching process to form the recess regions 32. The dielectric structure may include materials having different dielectric constants.

The dielectric structure may include a seed liner 26, a conformal spacer 27, a protective spacer 29", and a low-k spacer 30'. The seed liner 26 may directly contact the sidewalls of the bit line contact plug 22 and the bit line 23. The conformal spacer 27 may cover the seed liner 26. The protective spacer 29" may cover the conformal spacer 27, and the low-k spacer 30' may cover the protective spacer 29". The seed liner 26 may be positioned between the conformal spacer 27 and the bit line contact plug 22. Also, the seed liner 26 may extend to be positioned between the conformal spacer 27 and the bit line 23. The conformal spacer 27 may be positioned between the protective spacer 29" and the seed liner 26, and the conformal spacer 27 may extend to be positioned between the gap-fill spacer 28 and the seed liner 26. The protective spacer 29" may be positioned between the low-k spacer 30' and the conformal spacer 27, and the bottom surface of the protective spacer 29" may contact the upper surface of the gap-fill spacer 28. The bottom surface of the low-k spacer 30' may contact the upper surface of the gap-fill spacer 28. The upper surface of the protective spacer 29" may be covered by the low-k spacer 30'.

The seed liner 26, the conformal spacer 27, the protective spacer 29", and the low-k spacer 30' may be sequentially stacked on the sidewall of the bit line 23. The seed liner 26, the conformal spacer 27, and the gap-fill spacer 28 may be stacked on the sidewall of the bit line contact plug 22. The sidewalls and bottom surfaces of the gap-fill spacer 28 may be covered by a stack of the seed liner 26 and the conformal spacers 27.

Figure 32:
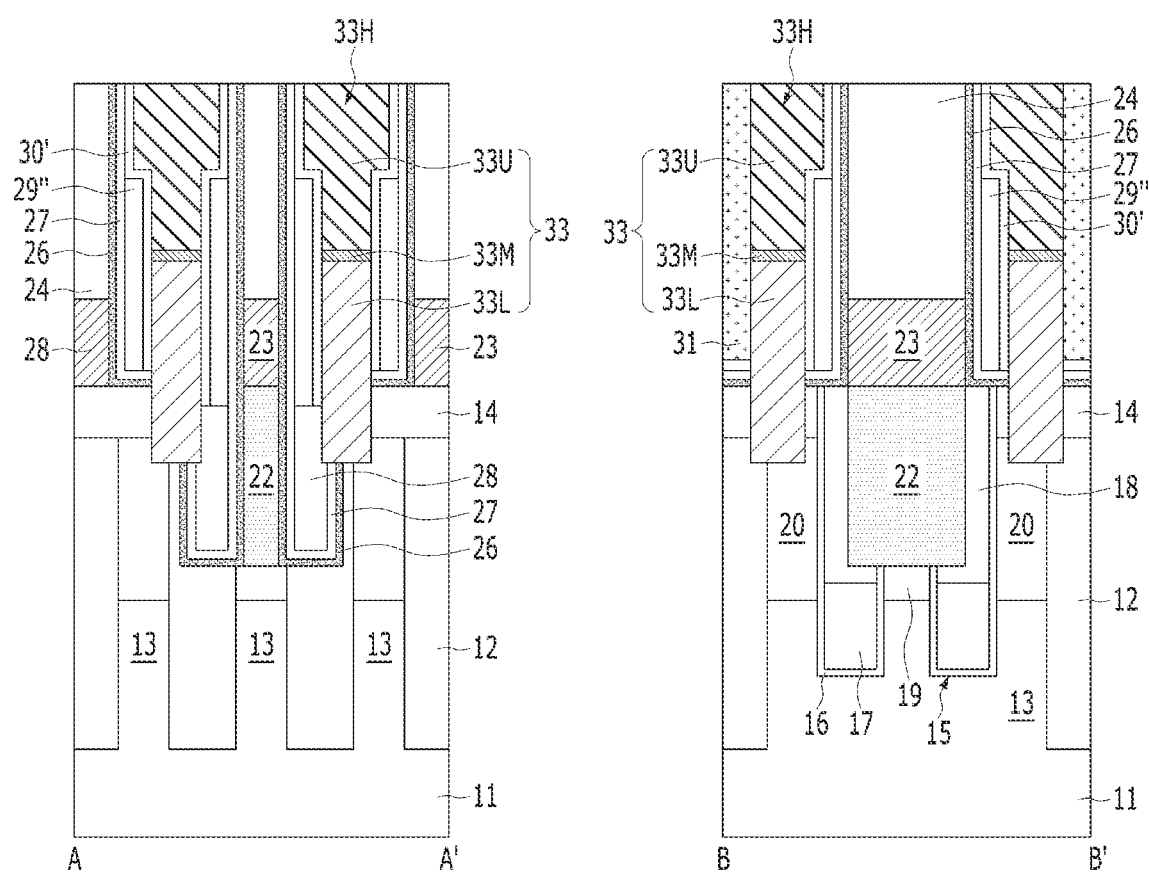

Referring to FIG. 32, a storage node contact plug 33 may be formed. The storage node contact plug 33 may fill the contact openings CO and the recess regions 32. The storage node contact plug 33 may contact the second impurity region 20. The storage node contact plug 33 may be adjacent to the bit line structure. From the perspective of a top view, a plurality of storage node contact plugs 33 may be positioned between a plurality of bit line structures. In a direction parallel to the bit line 23, a plurality of storage node contact plugs 33 and a plurality of plug isolation layers 31 may be alternately positioned between neighboring bit lines 23.

In the storage node contact plug 33, a lower plug 33L, an ohmic contact layer 33M, and an upper plug 33U may be sequentially stacked.

As described above, the seed liner 26, the conformal spacer 27, and the gap-fill spacer 28 may be positioned between the bit line contact plug 22 and the lower plug 33L. The seed liner 26, the conformal spacer 27, the protective spacer 29", and the low-k spacer 30' may be positioned between the bit line 23 and the lower plug 33L.

The seed liner 26 and the gap-fill spacer 28 may include silicon nitride, and the conformal spacer 27 and the low-k spacer 30' may include a low-k material. The protective spacer 29" may include silicon oxide. Accordingly, a dielectric structure may have an NKOK structure and may be provided between the bit line 23 and the lower plug 33L, and a dielectric structure having an NKN structure may be provided between the bit line contact plug 22 and the lower plugs 33L.

According to another embodiment of the present invention, the protective spacer 29" may be replaced with an air gap. In this case, an NKAK (Nitride-Low k-Air gap-Low k) structure may be provided between the bit line 23 and the lower plug 33L.

According to another embodiment of the present invention, a silicon nitride liner may be further formed over the low-k spacer 30', and thus, an NKOKN (Nitride-Low k-Oxide-Low k-Nitride) structure may be provided. The NKOKN structure may be transformed into an NKOKN structure by replacing the protective spacer 29" with an air gap.

The parasitic capacitance between the bit line 23 and the lower plug 33L may be reduced by the conformal spacer 27 and the low-k spacer 30'. The step coverage of the conformal spacer 27 may be improved by the seed liner 26. The loss of the conformal spacer 27 may be prevented by the protective spacer 29".

Since the low-k spacer 30' fully covers the protective spacer 29", a short or bridge between the storage node contact plug 33 and the bit line 23 may be prevented.

FIG. 33 is a diagram illustrating a semiconductor device 400 in accordance with another embodiment of the present invention. In FIG. 33, the same reference numerals also appearing in FIGS. 5 to 6B may denote the same constituent elements, and detailed descriptions thereon may be omitted below.

Referring to FIG. 33, the semiconductor device 400 may include a plurality of memory cells. Each memory cell may include a cell transistor including a buried word line 207, a bit line 213, and a memory element 230, Other constituent elements except for the storage node contact plug 221B may be the same as those of FIGS. 5 to 6B. A first spacer structure 215L may be formed between the bit line contact plug 212 and the storage node contact plug 221B. A second spacer structure 215UB may be formed between the bit line 213 and the storage node contact plug 221B. The first spacer structure 215L may include a seed liner 216, a conformal spacer 217, and a gap-fill spacer 218. The second spacer structure 215UB may include the seed liner 216, the conformal spacer 217, the protective spacer 219 and a low-k spacer 220. The conformal spacer 217 and the low-k spacer 220 may have a lower dielectric constant than the seed liner 216. The conformal spacer 217 and the low-k spacer 220 may include SiC, SiCO, SiCN, SiOCN, SiBN, or SiBCN. The conformal spacer 217 and the low-k spacer 220 may have a lower dielectric constant than silicon nitride, and they may include different low-k materials. The protective spacer 219 may include silicon oxide.

The seed liner 216 may have a thickness of approximately 20 Å or less. In an embodiment, the seed liner 216 may have a thickness of approximately 1 to approximately 20 Å. The seed liner 216 may serve as a seed for uniform deposition of the conformal spacer 217, The conformal spacer 217 and the seed liner 216 may directly contact each other. The total thickness of the conformal spacer 217 and the protective spacer 219 may be greater than the thickness of the seed liner 216.

A second spacer structure 215UB may have an NKOK structure and may be provided between the bit line 213 and the storage node contact plug 221B, and a first spacer structure 215L having an NKN structure may be provided between the bit line contact plug 212 and the storage node contact plug 221B.

According to another embodiment of the present invention, as referred to in FIG. 6C, the protective spacer 219 may be replaced with an air gap. In this case, a second spacer structure 215UB having a NKAK (Nitride-Low k-Air gap-Low k) structure may be provided between the bit line 213 and the storage node contact plug 221B, and a first spacer structure 215L having an NKN structure may be provided between the bit line contact plug 212 and the storage node contact plug 221B.

The storage node contact plug 221B of the semiconductor device 400 may be formed between the neighboring bit line structures. The storage node contact plug 221B may be coupled to the second impurity region 210. The storage node contact plug 221B may include a lower plug 222 and an upper plug 2243. The storage node contact plug 221B may further include an ohmic contact layer 223 between the lower plug 222 and the upper plug 2248. The ohmic contact layer 223 may include a metal-containing material such as, for example, a metal silicide. The lower plug 222 may include a silicon-containing material such as, for example, polysilicon. The upper plug 224B may include a metal-containing material such as, for example, a metal nitride, a metal material, or a combination thereof.

The upper plug 224B may include an extended portion 224E extending to overlap with the upper surface of the bit line hard mask 214. The extended portion 224E may be a landing pad, and a memory element 230 may be formed over the extended portion 224E of the upper plug 224B. The memory element 230 may include a capacitor including a storage node.

Figure 34:
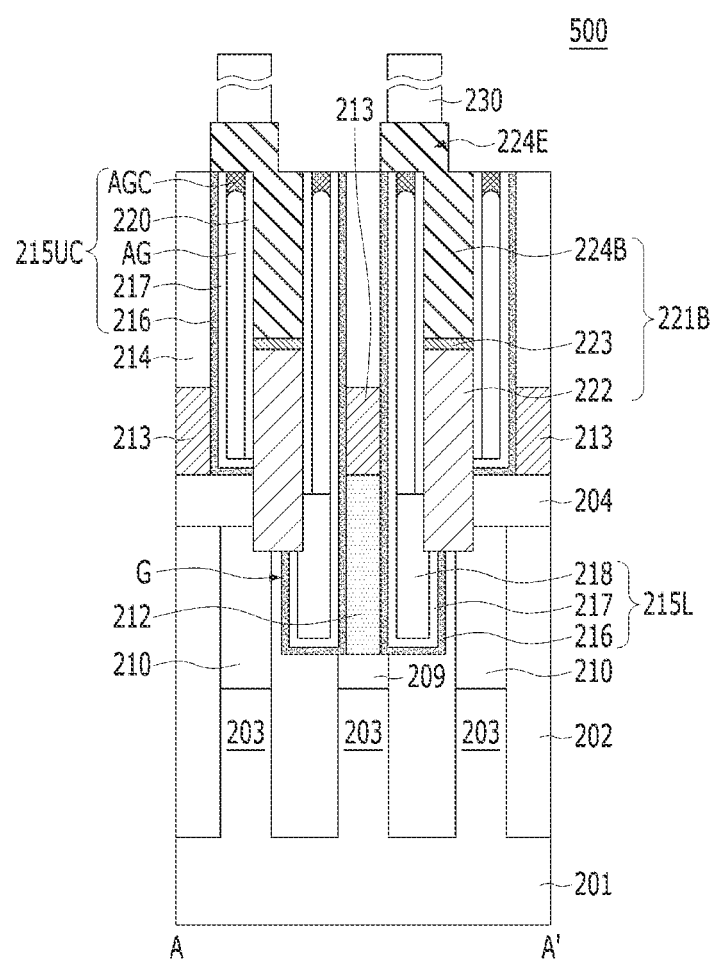

FIG. 34 is a diagram illustrating a semiconductor device 500 in accordance with another embodiment of the present invention. In FIG. 34, the same reference numerals also appearing in FIGS. 5 to 6C and 33 may denote the same constituent elements. Detailed descriptions of the same elements may be omitted.

Referring now to FIG. 34, the semiconductor device 500 may include a plurality of memory cells. Each memory cell may include a cell transistor including a buried word line 207 (see FIG. 6B), a bit line 213, and a memory element 230. Other constituent elements except for the air gap AG and the air gap capping layer AGC may be the same as those in FIG. 33. A first spacer structure 215L may be formed between the bit line contact plug 212 and the storage node contact plug 221B. A second spacer structure 215UC may be formed between the bit line 213 and the storage node contact plug 221B. The first spacer structure 215L may include a seed liner 216, a conformal spacer 217, and a gap-fill spacer 218. The second spacer structure 215UC may include the seed liner 216, the conformal spacer 217, the air gap AG, the air gap capping layer AGC, and a low-k spacer 220. The conformal spacer 217 and the low-k spacer 220 may have a lower dielectric constant than the seed liner 216. The conformal spacer 217 and the low-k spacer 220 may include SiC, SiCO, SiCN, SiOCN, SiBN, or SiBCN. The conformal spacer 217 and the low-k spacer 220 may have a lower dielectric constant than silicon nitride, and they may include different low-k materials. The protective spacer 219 may include silicon oxide.

The seed liner 216 may have a thickness of approximately 20 Å or less. In an embodiment, the seed liner 216 may have a thickness of approximately 1 to approximately 20 Å. The seed liner 216 may serve as a seed for uniform deposition of the conformal spacer 217. The conformal spacer 217 and the seed liner 216 may directly contact each other.

The second spacer structure 215UC having an NKAK structure may be provided between the bit line 213 and the storage node contact plug 221B. The first spacer structure 215L of an NKN structure may be provided between the bit line contact plug 212 and the storage node contact plug 221B. The upper side of the air gap AG may be sealed by the air gap capping layer AGC. The air gap capping layer AGC may include silicon nitride, silicon oxide, silicon carbon oxide, or a combination thereof. The air gap AG may be parallel to both sidewalls of the bit line 213. A pair of air gaps AG may be formed.

The storage node contact plug 221B of the semiconductor device 500 may be formed between the neighboring bit line structures. The storage node contact plug 221B may be coupled to the second impurity region 210. The storage node contact plug 221B may include a lower plug 222 and an upper plug 224B separated with an ohmic contact layer 223 formed between the lower plug 222 and the upper plug 224B. The ohmic contact layer 223 may include a metal silicide. For example, the lower plug 222 may include polysilicon, and the upper plug 224B may include a metal nitride, a metal material, or a combination thereof.

The upper plug 224B may include an extended portion 224E extending to overlap with the upper surface of the bit line hard mask 214. The extended portion 224E may be a landing pad, and the memory element 230 may be formed over the extended portion 224E of the upper plug 224B. The memory element 230 may include a capacitor including a storage node.

A pair of the air gaps AG may be fully covered by the air gap capping layer AGC. According to another embodiment of the present invention, one air gap AG of the pair of air gaps AG may be fully covered by the air gap capping layer AGC, and the other air gap AG may be partially capped by the extended portion 224E of the upper plug 224B.

According to embodiments of the present invention, since a low-k material is deposited by using a thin seed liner, it is possible to improve the step coverage of the low-k material.

According to embodiments of the present invention, an increase in parasitic capacitance may be suppressed by reducing the thickness of silicon nitride occupying in a spacer structure.

According to embodiments of the present invention, parasitic capacitance between a bit line contact plug and a storage node contact plug may be decreased by forming a low-k material between the bit line contact plug and the storage node contact plug.

According to embodiments of the present invention, the parasitic capacitance between a bit line and a storage node contact plug may be decreased by forming a low-k material between the bit line and the storage node contact plug.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:
   a bit line structure including a bit line contact plug, a bit line, and a bit line hard mask that are sequentially stacked over a substrate;
   a storage node contact plug that is spaced apart from the bit line structure;
   a conformal spacer that is positioned between the bit line and the storage node contact plug and includes a low-k material; and
   a seed liner that is positioned between the conformal spacer and the bit line,
   wherein the seed liner is thinner than the conformal spacer.

2. The semiconductor device of claim 1, wherein the conformal spacer and the seed liner directly contact each other.

3. The semiconductor device of claim 1, wherein the conformal spacer has a lower dielectric constant than the seed liner.

4. The semiconductor device of claim 1, wherein the conformal spacer includes an impurity-containing silicon-based dielectric material including an impurity of at least one of carbon, or boron.

5. The semiconductor device of claim 1, wherein the conformal spacer includes at least one of SiC, SiCO, SiCN, SiOCN, SiBN or SiBCN.

6. The semiconductor device of claim 1, wherein the seed liner includes silicon nitride.

7. The semiconductor device of claim 1, wherein the seed liner has a thickness of approximately 1 to approximately 20 Å.

8. The semiconductor device of claim 1, wherein the seed liner directly contacts the bit line and the bit line contact plug.

9. The semiconductor device of claim 1, wherein each of the seed liner and the conformal spacer extends to be positioned between the bit line contact plug and the storage node contact plug.

10. The semiconductor device of claim 9, further comprising:
a gap-fill spacer positioned between the bit line contact plug and the storage node contact plug; and
wherein the seed liner and the conformal spacer cover sidewalls and a bottom surface of the gap-fill spacer.

11. The semiconductor device of claim 9, wherein the seed liner and the gap-fill spacer include silicon nitride, and
the conformal spacer has a lower dielectric constant than the silicon nitride.

12. The semiconductor device of claim 1, wherein the seed liner and the conformal spacer have a line shape contacting both sidewalls of the bit line.

13. The semiconductor device of claim 1, further comprising:
a protective spacer positioned between the conformal spacer and the storage node contact plug, the protective spacer being in contact with the conformal spacer; and
a low-k spacer positioned between the protective spacer and the storage node contact plug,
wherein the low-k spacer is thinner than the protective spacer.

14. The semiconductor device of claim 13, wherein the low-k spacer and the protective spacer include different materials.

15. The semiconductor device of claim 13, wherein the conformal spacer and the low-k spacer include a same material.

16. The semiconductor device of claim 13, wherein the protective spacer includes silicon oxide, and
the low-k spacer includes at least one of SiC, SiCO, SiCN, SiOCN, SiBN or SiBCN.

17. The semiconductor device of claim 13, wherein an upper surface of the protective spacer is positioned at a lower level than an upper surface of the hit line structure, and
the low-k spacer fully covers the protective spacer.

18. The semiconductor device of claim 13, wherein a total thickness of the conformal spacer and the protective spacer is greater than a thickness of the seed liner.

19. A semiconductor device, comprising:
bit lines that are spaced apart from each other by a line-shaped opening over a substrate;
bit line contact plugs that are positioned below the bit lines, respectively;
a plurality of plug isolation layers that divide the line-shaped opening into a plurality of contact openings;
storage node contact plugs that respectively fill the contact openings;
a first spacer structure that is disposed between the storage node contact plugs and the bit lines, and includes a stack of a first silicon nitride, a first low-k material, silicon oxide, and a second low-k material; and
a second spacer structure that is disposed between the bit line contact plugs and the storage node contact plugs, and includes a stack of a second silicon nitride, a third low-k material, and a third silicon nitride,
wherein the second silicon nitride extends from the first silicon nitride, and the third low-k material extends from the first low-k material.

20. The semiconductor device of claim 19, wherein the first silicon nitride is positioned between the bit lines and the first low-k material, and
the first silicon nitride is thinner than the first low-k material.

21. The semiconductor device of claim 19, wherein the first low-k material, the second low-k material, and the third low-k material have a lower dielectric constant than the first and second silicon nitrides.

22. The semiconductor device of claim 19, wherein the first low-k material, the second low-k material, and the third low-k material include a same material.

23. The semiconductor device of claim 19, wherein the first low-k material, the second low-k material, and the third low-k material include at least one of SiC, SiCO, SiCN, SiOCN, SiBN or SiBCN.

24. The semiconductor device of claim 19, wherein the first spacer structure further includes an additional silicon nitride over the second low-k material,
wherein the additional silicon nitride is positioned between the second low-k material and the storage node contact plugs.

25. The semiconductor device of claim 19, wherein the plug isolation layer is of the same material as at least one among the first low-k material, the second low-k material, and the third low-k material.

26. The semiconductor device of claim 19, wherein the plug isolation layer includes a boron-containing low-k material, and
the first low-k material, the second low-k material, and the third low-k material include a carbon-containing low-k material.

27. The semiconductor device of claim 19, wherein a total thickness of the first low-k material and silicon oxide is formed greater than a thickness of the first silicon nitride.

28. The semiconductor device of claim 19, wherein the first silicon nitride is formed to have a thickness of approximately 1 to approximately 20 Å.

* * * * *